(12) United States Patent
Park et al.

(10) Patent No.: US 12,243,946 B2
(45) Date of Patent: Mar. 4, 2025

(54) INTEGRATED CIRCUIT DEVICES INCLUDING A COMMON GATE ELECTRODE AND METHODS OF FORMING THE SAME

(71) Applicant: Samsung Electronics Co., Ltd., Suwon-si (KR)

(72) Inventors: Sooyoung Park, Clifton Park, NY (US); Seunghyun Song, Albany, NY (US); Byounghak Hong, Albany, NY (US); Seungchan Yun, Waterford, NY (US)

(73) Assignee: Samsung Electronics Co., Ltd. (KR)

( * ) Notice: Subject to any disclaimer, the term of this patent is extended or adjusted under 35 U.S.C. 154(b) by 573 days.

(21) Appl. No.: 17/504,755

(22) Filed: Oct. 19, 2021

(65) Prior Publication Data
US 2023/0049816 A1 Feb. 16, 2023

Related U.S. Application Data

(60) Provisional application No. 63/232,336, filed on Aug. 12, 2021.

(51) Int. Cl.
| | |
|---|---|
| *H01L 29/78* | (2006.01) |
| *H01L 29/06* | (2006.01) |
| *H01L 29/66* | (2006.01) |
| *H01L 29/786* | (2006.01) |

(52) U.S. Cl.
CPC .... *H01L 29/78696* (2013.01); *H01L 29/0669* (2013.01); *H01L 29/66742* (2013.01); *H01L 29/78618* (2013.01)

(58) Field of Classification Search
CPC .......... H01L 29/78696; H01L 29/0669; H01L 29/66742; H01L 29/78618; H01L 21/823437; H01L 21/823828; H01L 27/088; H01L 27/092; H01L 29/0673; H01L 29/42376; H01L 29/66439; H01L 29/775; B82Y 10/00
See application file for complete search history.

(56) References Cited

U.S. PATENT DOCUMENTS

| | | | | |
|---|---|---|---|---|
| 10,872,824 | B2* | 12/2020 | Merckling | H01L 27/092 |
| 10,879,308 | B1* | 12/2020 | Ando | H10B 63/845 |
| 2016/0086861 | A1* | 3/2016 | Kim | H01L 27/092 |
| | | | | 257/351 |
| 2016/0172358 | A1* | 6/2016 | Hatcher | H01L 29/775 |
| | | | | 257/401 |

(Continued)

*Primary Examiner* — S M Sohel Imtiaz
(74) *Attorney, Agent, or Firm* — Myers Bigel, P.A.

(57) ABSTRACT

Integrated circuit devices and methods of forming the same are provided. Integrated circuit devices may include a first channel layer including a first surface, a second channel layer that is spaced apart from the first channel layer in a first direction and includes a second surface, a first gate electrode and a second gate electrode. The first surface and the second surface may be spaced apart from each other in the first direction and may face opposite directions. The first channel layer may be in the first gate electrode, and the first gate electrode may be absent from the first surface of the first channel layer. The second channel layer may be in the second gate electrode, and the second gate electrode may be absent from the second surface of the second channel layer.

20 Claims, 31 Drawing Sheets

(56) References Cited

U.S. PATENT DOCUMENTS

| | | | |
|---|---|---|---|
| 2019/0115424 A1* | 4/2019 | Park | H01L 29/66545 |
| 2020/0006155 A1* | 1/2020 | Chiang | H01L 21/823864 |
| 2020/0091289 A1* | 3/2020 | Chang | H01L 29/42392 |
| 2020/0411661 A1* | 12/2020 | Guler | H01L 29/66484 |
| 2021/0028169 A1* | 1/2021 | Smith | H01L 21/8221 |
| 2021/0098500 A1* | 4/2021 | Wang | H01L 21/845 |
| 2021/0175209 A1* | 6/2021 | Fulford | H01L 29/42392 |
| 2022/0328698 A1* | 10/2022 | Lin | H01L 21/3065 |

* cited by examiner

INTEGRATED CIRCUIT DEVICES INCLUDING A COMMON GATE ELECTRODE AND METHODS OF FORMING THE SAME

CROSS-REFERENCE TO RELATED APPLICATION

This application claims priority to U.S. Provisional Application Ser. No. 63/232,336, entitled TRIGATE CMOS STRUCTURES HAVING IMPROVED PERFORMANCE, filed in the USPTO on Aug. 12, 2021, the disclosure of which is hereby incorporated by reference herein in its entirety.

FIELD

The present disclosure generally relates to the field of electronics and, more particularly, to integrated circuit devices including a common gate electrode.

BACKGROUND

As the integration density of an integrated circuit device increases, a parasitic capacitance between conductive elements therein becomes a major factor degrading the performance (e.g., the AC performance) of the integrated circuit device. Accordingly, structures and methods of forming an integrated circuit device that has a high integration density but still has a lower parasitic capacitance have been developed.

SUMMARY

According to some embodiments of the present invention, integrated circuit devices may include a first channel layer including a first surface, a second channel layer that is spaced apart from the first channel layer in a first direction and includes a second surface, a first gate electrode and a second gate electrode. The first surface and the second surface may be spaced apart from each other in the first direction and may face opposite directions. The first channel layer may be in the first gate electrode, and the first gate electrode may be absent from the first surface of the first channel layer. The second channel layer may be in the second gate electrode, and the second gate electrode may be absent from the second surface of the second channel layer.

According to some embodiments of the present invention, integrated circuit devices may include a first channel layer including a first surface and a second channel layer that is spaced apart from the first channel layer in a first direction and includes a second surface. The first surface and the second surface may be spaced apart from each other in the first direction and may face opposite directions. The integrated circuit device may also include a first gate electrode and a second gate electrode. The first channel layer may be in the first gate electrode, and the first gate electrode may include a third surface. The second channel layer may be in the second gate electrode, and the second gate electrode may include a fourth surface. The third surface and the fourth surface may be spaced apart from each other in the first direction and may face opposite directions. A first center of the first channel layer in the first direction may be closer to the third surface of the first gate electrode than a center of the third surface and the fourth surface in the first direction, and a second center of the second channel layer in the first direction may be closer to the fourth surface of the second gate electrode than the center of the third surface and the fourth surface in the first direction.

According to some embodiments of the present invention, methods of forming an integrated circuit device may include forming a preliminary structure that may include an insulating layer comprising an opening, a first channel layer that may be in the opening and may include a first surface contacting the insulating layer, and a second channel layer that may be in the opening and may be spaced apart from the first channel layer in a first direction. The second channel layer may include a second surface that contacts the insulating layer, and the first surface and the second surfaces may be spaced apart from each other in the first direction and may face opposite directions. The methods may also include forming a gate electrode in the opening. The first channel layer and the second channel layer may be in the gate electrode.

DETAILED DESCRIPTION

A portion of a source/drain region that overlaps a gate electrode is one of the major factors contributing to a parasitic capacitance. Accordingly, if an integrated circuit device includes a source/drain region having a large portion that overlaps a gate electrode, the AC performance of the integrated circuit device may be significantly degraded. According to some embodiments of the present invention, a source/drain region may have a smaller portion overlapping a gate electrode, and thus the AC performance of an integrated circuit device may be improved. According to some embodiments, a gate electrode may have a narrower width to reduce a portion of the source/drain region, which overlaps the gate electrode, and may expose a portion of a channel layer. In some embodiments, the channel layer may be a nanosheet, and the gate electrode may expose only one side surface of the channel layer. Accordingly, the DC performance of the integrated circuit device may not be significantly affected by the gate electrode that has a narrower width and exposes the channel layer.

Figure 1:
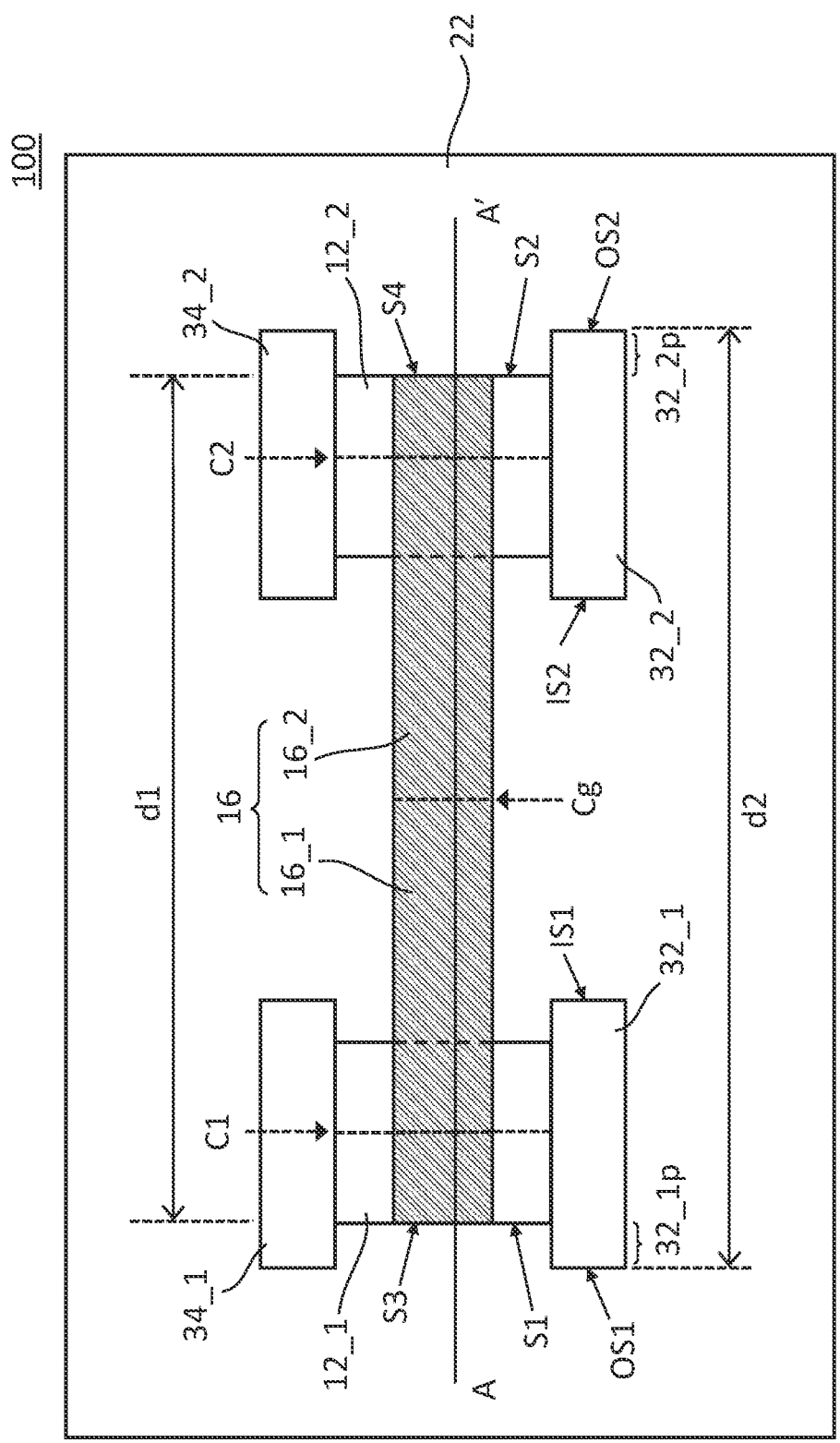
FIG. 1 is a layout of an integrated circuit device according to some embodiments of the present invention.
Figure 2:
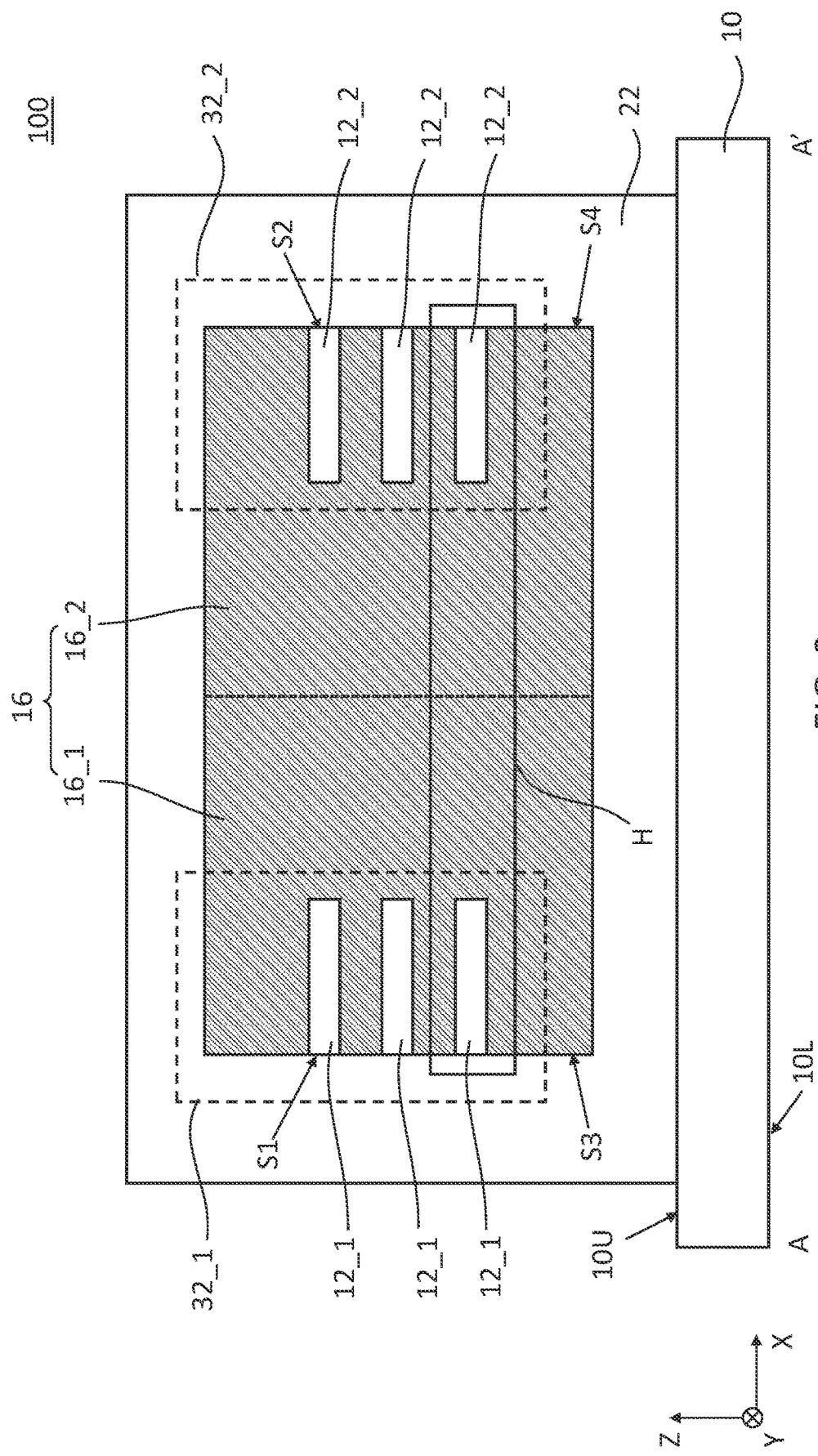
FIG. 2 is a cross-sectional view of the integrated circuit device taken along the line A-A' in FIG. 1.
Figure 3:
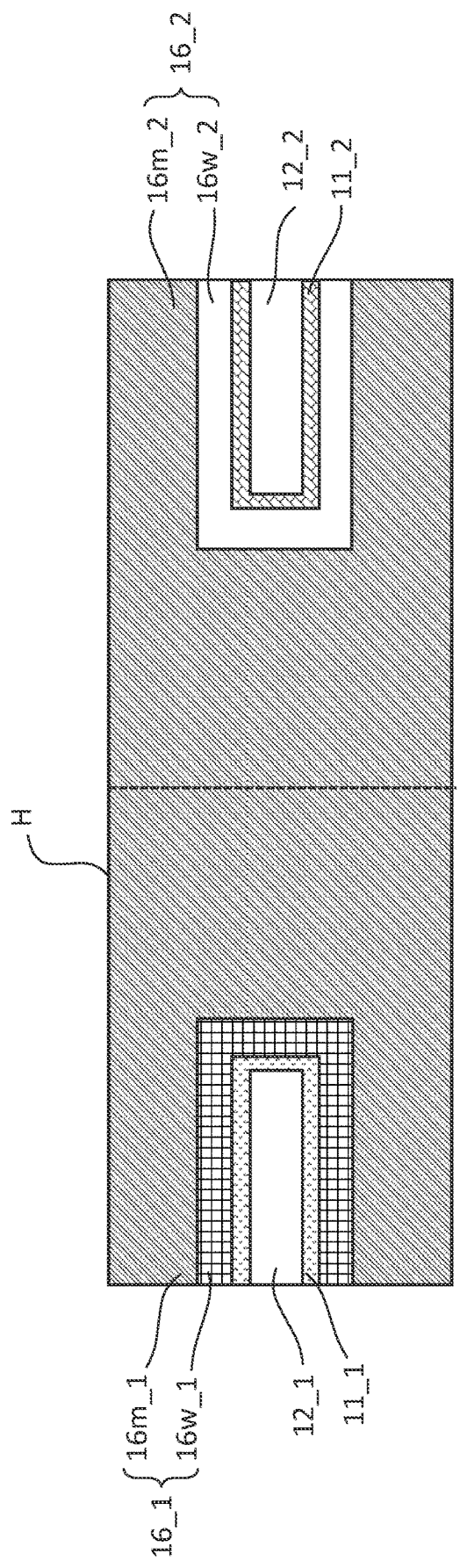
FIG. 3 is a cross-sectional view of the region H in FIG. 2.

FIG. 1 is a layout of an integrated circuit device 100 according to some embodiments of the present invention, FIG. 2 is a cross-sectional view of the integrated circuit device 100 taken along the line A-A' in FIG. 1, and FIG. 3 is a cross-sectional view of the region H in FIG. 2. Outlines of source/drain regions (e.g., a first source/drain region 32_1 and a second source/drain region 32_2 in FIG. 1) are illustrated in FIG. 2 to show spatial relationships between those source/drain regions and other elements.

Referring to FIGS. 1 and 2, the integrated circuit device 100 may include a first channel layer 12_1 and a second channel layer 12_2 on a substrate 10. The first channel layer 12_1 and the second channel layer 12_2 are spaced apart from each other in a first direction (e.g., a X direction in FIG. 1). The first direction may be parallel to an upper surface 10U of the substrate 10. The upper surface 10U of the substrate 10 may face the first channel layer 12_1 and the second channel layer 12_2. The substrate 10 may further include a lower surface 10L that is opposite the upper surface 10U and is parallel to the upper surface 10U. The first direction may be a first horizontal direction.

The first channel layer 12_1 may include a first surface S1, and the second channel layer 12_2 may include a second surface S2. The first surface S1 and the second surface S2 may be spaced apart from each other in the first direction and may face opposite directions as illustrated in FIGS. 1 and 2.

The integrated circuit device 100 may also include a gate electrode 16 that includes a first portion 16_1 and a second portion 16_2. The first channel layer 12_1 and the second channel layer 12_2 may be in the gate electrode 16. In some embodiments, the first channel layer 12_1 may be in the first portion 16_1 of the gate electrode 16, and the second channel layer 12_2 may be in the second portion 16_2 of the gate electrode 16. The gate electrode 16 may include a third surface S3 and a fourth surface S4 that is opposite the third surface S3 and is spaced apart from the third surface S3 in the first direction. In some embodiments, the first surface S1 of the first channel layer 12_1 and the third surface S3 of the gate electrode 16 may be coplanar with each other, and the second surface S2 of the second channel layer 12_2 and the fourth surface S4 of the gate electrode 16 may be coplanar with each other as illustrated in FIG. 2. Accordingly, the gate electrode 16 exposes the first surface S1 of the first channel layer 12_1 and the second surface S2 of the second channel layer 12_2. In some embodiments, the gate electrode 16 may continuously extend from the third surface S3 to the fourth surface S4 as illustrated in FIG. 2.

The integrated circuit device 100 may further include a first source/drain region 32_1 and a second source/drain region 32_2. Both the first source/drain region 32_1 and the second source/drain region 32_2 are spaced apart from the gate electrode 16 in a second direction (e.g., a Y direction in FIG. 1). The second direction may be parallel to the upper surface 10U of the substrate 10 and may be different from the first direction. In some embodiments, the first direction may be perpendicular to the second direction as illustrated in FIG. 1. The second direction may be a second horizontal direction. The first source/drain region 32_1 may contact the first channel layer 12_1 and the second source/drain region 32_2 may contact the second channel layer 12_2.

The first source/drain region 32_1 may include a first portion 32_1p that does not overlap the gate electrode 16 in the second direction, and the second source/drain region 32_2 may include a second portion 32_2p that does not overlap the gate electrode 16. The first portion 32_1p and the second portion 32_2p, therefore, may not contribute to a parasitic capacitance with the gate electrode 16. As used herein, "an element A overlapping an element B in a direction W" (or similar language) may mean that at least one line extending in the direction W can be drawn that intersects both elements A and B.

The first source/drain region 32_1 may be spaced apart from the second source/drain region 32_2 in the first direction. The first source/drain region 32_1 may include a first inner surface IS1 facing the second source/drain region 32_2 and a first outer surface OS1 that is opposite the first inner surface IS1. The second source/drain region 32_2 may include a second inner surface IS2 facing the first source/drain region 32_1 and a second outer surface OS2 that is opposite the second inner surface IS2. The first outer surface OS1 and the second outer surface OS2 may be spaced apart from each other in the first direction and may face opposite directions as illustrated in FIG. 1.

In some embodiments, the third surface S3 of the gate electrode 16 may be spaced apart from the fourth surface S4 of the gate electrode 16 in the first direction by a first distance d1 that is shorter than a second distance d2 between the first outer surface OS1 of the first source/drain region 32_1 and the second outer surface OS2 of the second source/drain region 32_2 in the first direction as illustrated in FIG. 1. In some embodiments, the third surface S3 of the gate electrode 16 may be between the first outer surface OS1 of the first source/drain region 32_1 and the fourth surface S4 of the gate electrode 16 in the first direction, and the fourth surface S4 of the gate electrode 16 may be between the second outer surface OS2 of the second source/drain region 32_2 and the third surface S3 of the gate electrode 16 in the first direction.

The first channel layer 12_1 may have a first center C1 in the first direction, the second channel layer 12_2 may have a second center C2 in the first direction, and the gate electrode 16 may have a gate center Cg in the first direction. In some embodiments, the first center C1 may be closer to the third surface S3 of the gate electrode 16 than the gate center Cg, and the second center C2 may be closer to the fourth surface S4 of the gate electrode 16 than the gate center Cg as illustrated in FIG. 1.

The integrated circuit device 100 may further include a third source/drain region 34_1 that may be spaced apart from the gate electrode 16 (e.g., the first portion 16_1 of the gate electrode 16) in the second direction and may contact the first channel layer 12_1 and a fourth source/drain region 34_2 that may be spaced apart from the gate electrode 16 (e.g., the second portion 16_2 of the gate electrode 16) in the second direction and may contact the second channel layer 12_2.

The first channel layer 12_1, the first source/drain region 32_1, the third source/drain region 34_1, and the first portion 16_1 of the gate electrode 16 may constitute a first transistor, and the second channel layer 12_2, the second source/drain region 32_2, the fourth source/drain region 34_2, and the second portion 16_2 of the gate electrode 16 may constitute a second transistor. The first and second transistors may constitute a portion of a standard cell (e.g., an inverter, a 2-input NAND gate, a 3-input NAND gate, a 2-input NOR gate, a 3-input NOR gate, an And-Or inverter (AOI), an Or-And inverter (OAI), an XNOR gate, an XOR gate, a multiplexer (MUX), a latch, or a D-flip-flop). For example, the first and second transistors may constitute an inverter.

The first transistor and the second transistor may have the same conductivity type or may have different conductivity types. When the first and second transistors have different conductivity types, the first portion 16_1 and the second portion 16_2 of the gate electrode 16 may include different materials. In some embodiments, each of the first transistor and the second transistor may be a N-type transistor or a P-type transistor. In some embodiments, the first transistor may be an N-type transistor and the second transistor may be a P-type transistor, or the first transistor may be a P-type transistor and the second transistor may be an N-type transistor. The gate electrode 16 functions as gate electrodes of both the first and second transistors, and thus the gate electrode 16 may be a common gate electrode.

The integrated circuit device 100 may include an insulating layer 22 on the substrate 10. The gate electrode 16 and the first, second, third, and fourth source/drain regions 32_1, 32_2, 34_1, and 34_2 may be in the insulating layer 22. The insulating layer 22 may contact the first surface S1 of the first channel layer 12_1, the second surface S2 of the second channel layer 12_2, and the third and fourth surfaces S3 and S4 of the gate electrode 16 as illustrated in FIG. 2. The insulating layer 22 may also contact the first inner surface IS1 and the first outer surface OS1 of the first source/drain region 32_1 and the second inner surface IS2 and the second outer surface OS2 of the second source/drain region 32_2.

In some embodiments, the integrated circuit device 100 may include multiple first channel layers 12_1 and multiple second channel layers 12_2. For example, the integrated circuit device 100 may include three first channel layers 12_1 stacked in a third direction (e.g., a Z direction in FIG. 2) and three second channel layers 12_2 stacked in the third direction as illustrated in FIG. 2. The third direction may be perpendicular to the upper surface 10U of the substrate 10 and may be perpendicular to both the first direction and the second direction. The third direction may be a vertical direction.

Although not shown in FIGS. 1 and 2, the integrated circuit device 100 may further include conductive plugs and conductive wires. For example, the integrated circuit device 100 may include conductive plugs that are on and contact the first, second, third and fourth source/drain regions 32_1, 32_2, 34_1 and 34_2, respectively, and may include conductive wires that are on and contact those conductive plugs, respectively.

The substrate 10 may include, for example, semiconductor material(s) (e.g., silicon, germanium, silicon-germanium, and/or a Group III-V semiconductor compound). The substrate 10 may be a bulk substrate including only semiconductor material(s) or may include an insulating layer (e.g., a barrier insulating layer) on or below a semiconductor layer. Each of the first channel layer 12_1 and the second channel layer 12_2 may include, for example, semiconductor material(s) (e.g., silicon, germanium, silicon-germanium, and/or a Group III-V semiconductor compound). Each of the first channel layer 12_1 and the second channel layer 12_2 may be, for example, a nanosheet. In some embodiments, the nanosheet may have a thickness in a range of from 1 nm to 100 nm (e.g., 5 nm to 10 nm) in the third direction. In some embodiments, each of first channel layer 12_1 and the second channel layer 12_2 may be a fin-shaped channel layer or a nanowire. Each of the first, second, third, and fourth source/drain regions 32_1, 32_2, 34_1, and 34_2 may include, for example, semiconductor material(s) (e.g., silicon, germanium and silicon-germanium) and, in some embodiments, may also include impurities (e.g., boron (B), gallium (Ga), indium (In), aluminum (Al), phosphorus (P), arsenic (As), and/or antimony (Sib)). The insulating layer 22 may include, for example, silicon oxide, silicon nitride, silicon oxynitride, silicon carbide and/or a low k material.

Referring to FIG. 3, the integrated circuit device 100 may also include a first gate insulating layer 11_1 on the first channel layer 12_1 and a second gate insulating layer 11_2 on the second channel layer 12_2. Each of the first gate insulating layer 11_1 and the second gate insulating layer 11_2 may have a uniform thickness along a surface of a corresponding channel layer (i.e., the first channel layer 12_1 or the second channel layer 12_2). Each of the first gate insulating layer 11_1 and the second gate insulating layer 11_2 may be, for example, a silicon oxide layer and/or a high k dielectric layer including a high k material (e.g., hafnium silicate, zirconium silicate, hafnium dioxide and/or zirconium dioxide).

Although FIG. 3 illustrates each of the first gate insulating layer 11_1 and the second gate insulating layer 11_2 as a single layer, each of the first gate insulating layer 11_1 and the second gate insulating layer 11_2 may include multiple layers sequentially stacked on a corresponding channel layer. For example, each of the first gate insulating layer 11_1 and the second gate insulating layer 11_2 may include an interfacial layer and a high k dielectric layer, which are sequentially stacked on a corresponding channel layer. The interfacial layer may be, for example, a silicon oxide layer formed by an oxidation process (e.g., a thermal oxidation process).

The first portion 16_1 of the gate electrode 16 may include a first main gate layer 16m_1 and a first gate work function layer 16w_1 between the first channel layer 12_1 and the first main gate layer 16m_1. The second portion 16_2 of the gate electrode 16 may include a second main gate layer 16m_2 and a second gate work function layer 16w_2 between the second channel layer 12_2 and the second main gate layer 16m_2. In some embodiments, each of the first gate work function layer 16w_1 and the second gate work function layer 16w_2 may have a uniform thickness along a surface of a corresponding gate insulating layer (e.g., the first gate insulating layer 11_1 or the second gate insulating layer 11_2). Although FIG. 3 illustrates each of the first gate work function layer 16w_1 and the second gate work function layer 16w_2 as a single layer, in some embodiments, each of the first gate work function layer 16w_1 and the second gate work function layer 16w_2 may include multiple layers stacked.

Each of the first gate work function layer 16w_1 and the second gate work function layer 16w_2 may include an n-type work function layer (e.g., TiC layer, TiAl layer and/or TiAlC layer) or a p-type work function layer (e.g., TiN layer) depending on a conductivity type of the first and second transistors. Each of the first main gate layer 16m_1 and the second main gate layer 16m_2 may include, for example, tungsten (W), aluminum (Al) and/or copper (Cu).

Figure 4:
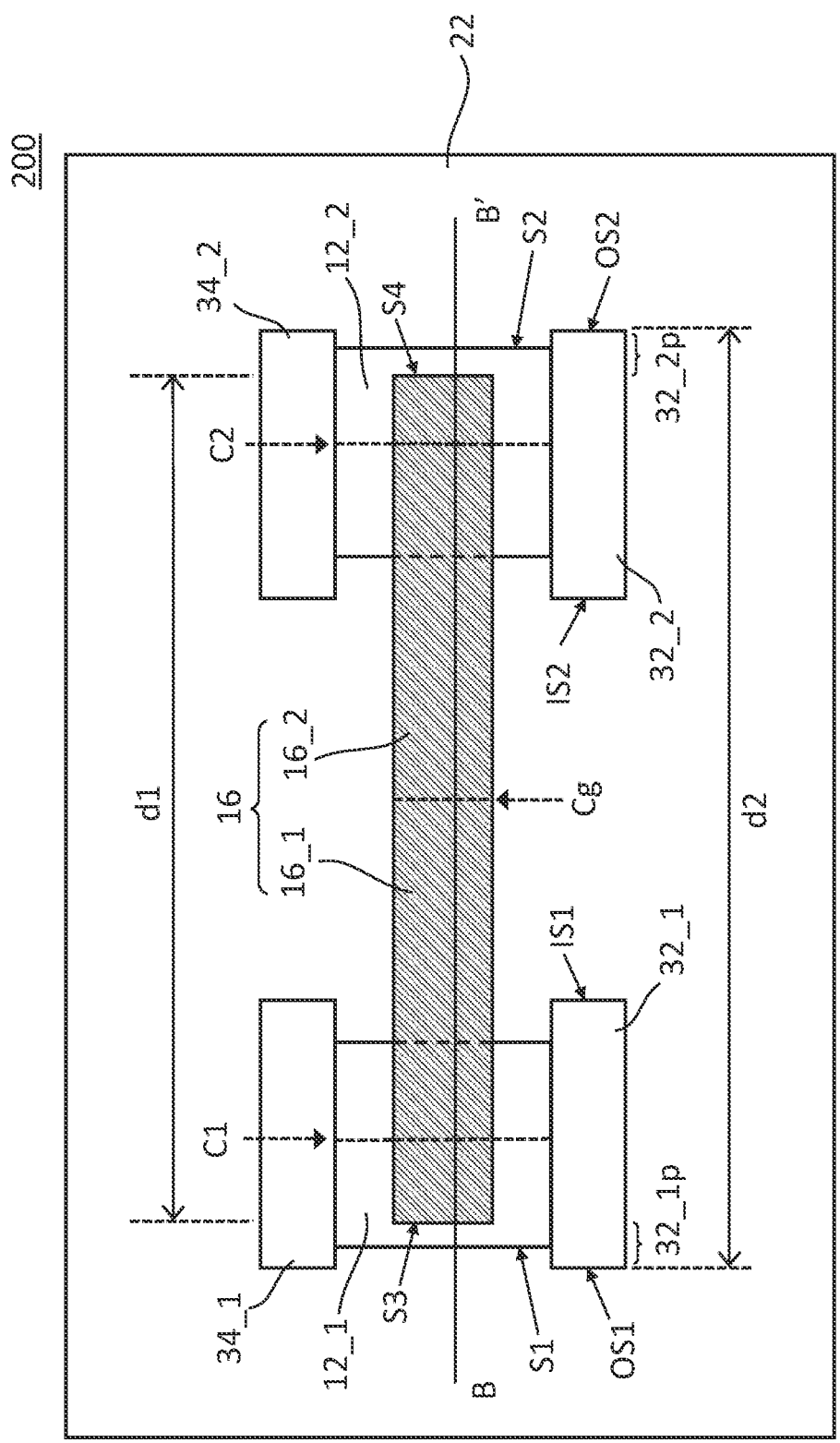
FIG. 4 is a layout of an integrated circuit device according to some embodiments of the present invention.
Figure 5:
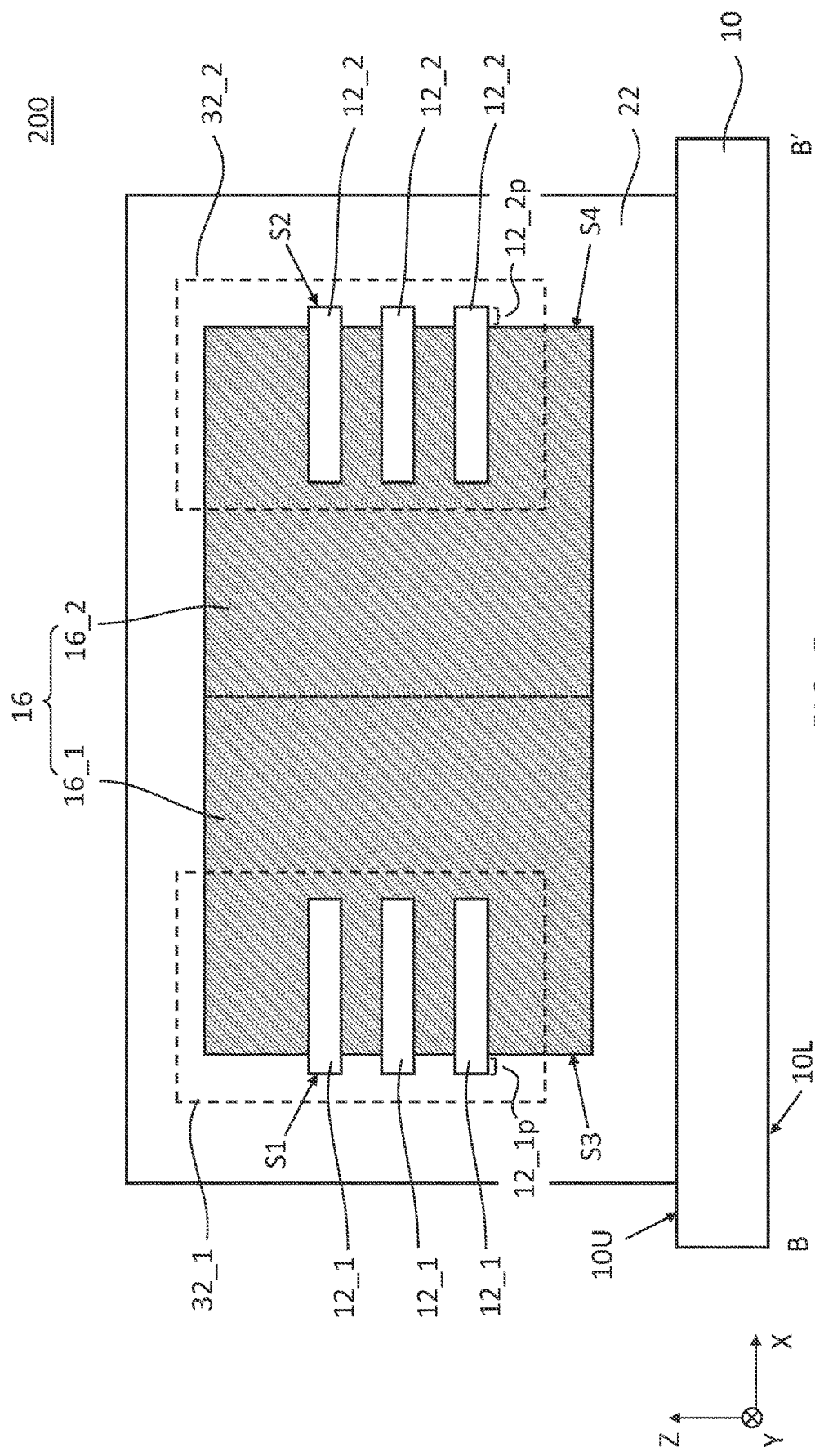
FIG. 5 is a cross-sectional view of the integrated circuit device taken along the line B-B' in FIG. 4.

FIG. 4 is a layout of an integrated circuit device 200 according to some embodiments of the present invention, and FIG. 5 is a cross-sectional view of the integrated circuit device 200 taken along the line B-B' in FIG. 4.

The integrated circuit device 200 is similar to the integrated circuit device 100 with a primary difference being that the first channel layer 12_1 includes a first protruding portion 12_1p, and the second channel layer 12_2 includes a second protruding portion 12_2p. The first protruding portion 12_1p may not be in the gate electrode 16 and may protrude outward beyond the third surface S3 of the gate electrode 16. The first protruding portion 12_1p may include the first surface S1 of the first channel layer 12_1. The second protruding portion 12_2p may not be in the gate electrode 16 and may protrude outward beyond the fourth surface S4 of the gate electrode 16. The second protruding portion 12_2p may include the second surface S2 of the second channel layer 12_2.

In some embodiments, a channel may be formed in the first protruding portion 12_1p of the first channel layer 12_1 by a fringe field of the gate electrode 16 even though the first protruding portion 12_1p is not covered by the gate electrode 16, and a channel may be formed in the second protruding portion 12_2p of the second channel layer 12_2 by a fringe field of the gate electrode 16 even though the second protruding portion 12_2p is not covered by the gate electrode 16.

Figure 6:
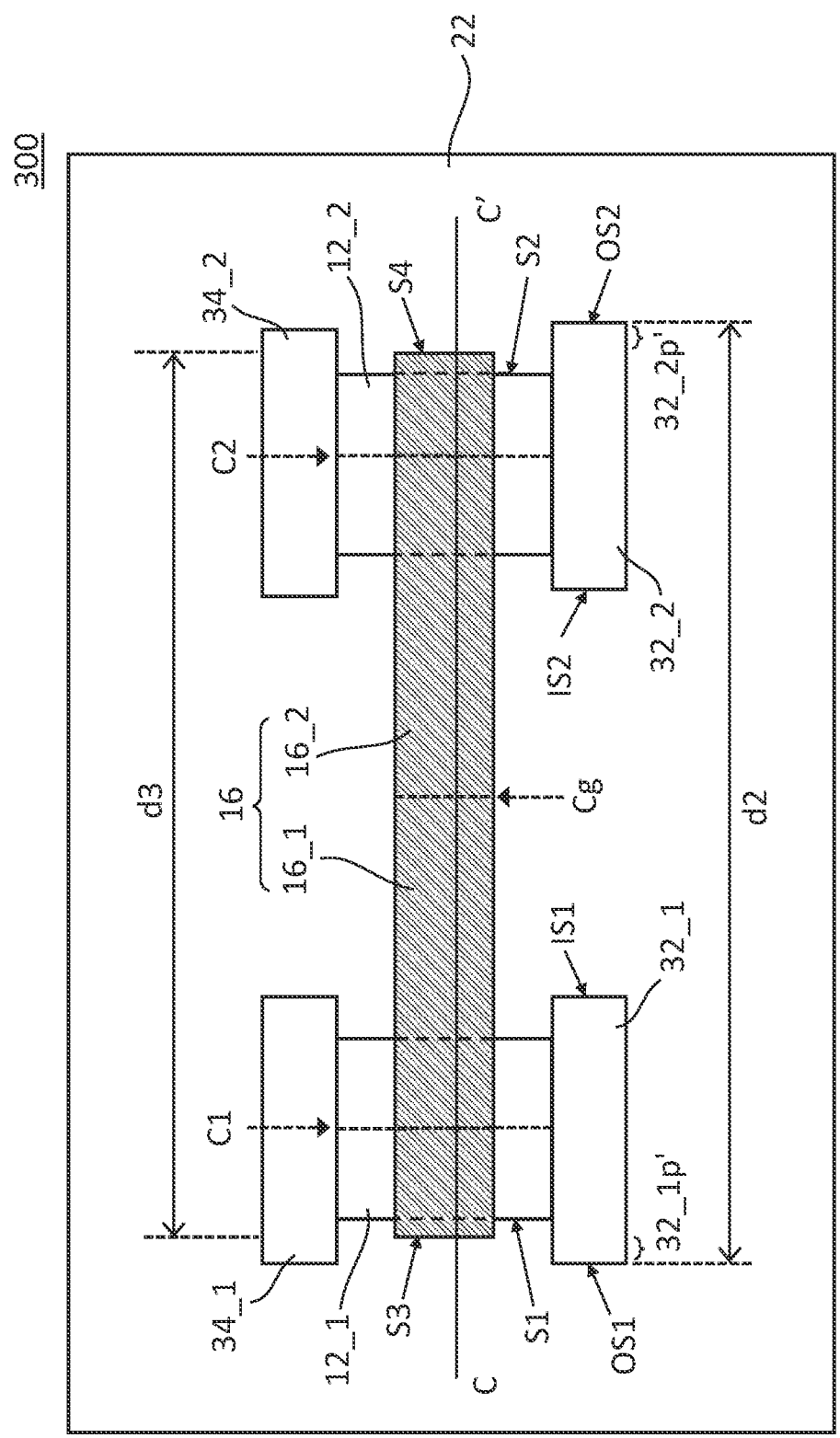
FIG. 6 is a layout of an integrated circuit device according to some embodiments of the present invention.
Figure 7:
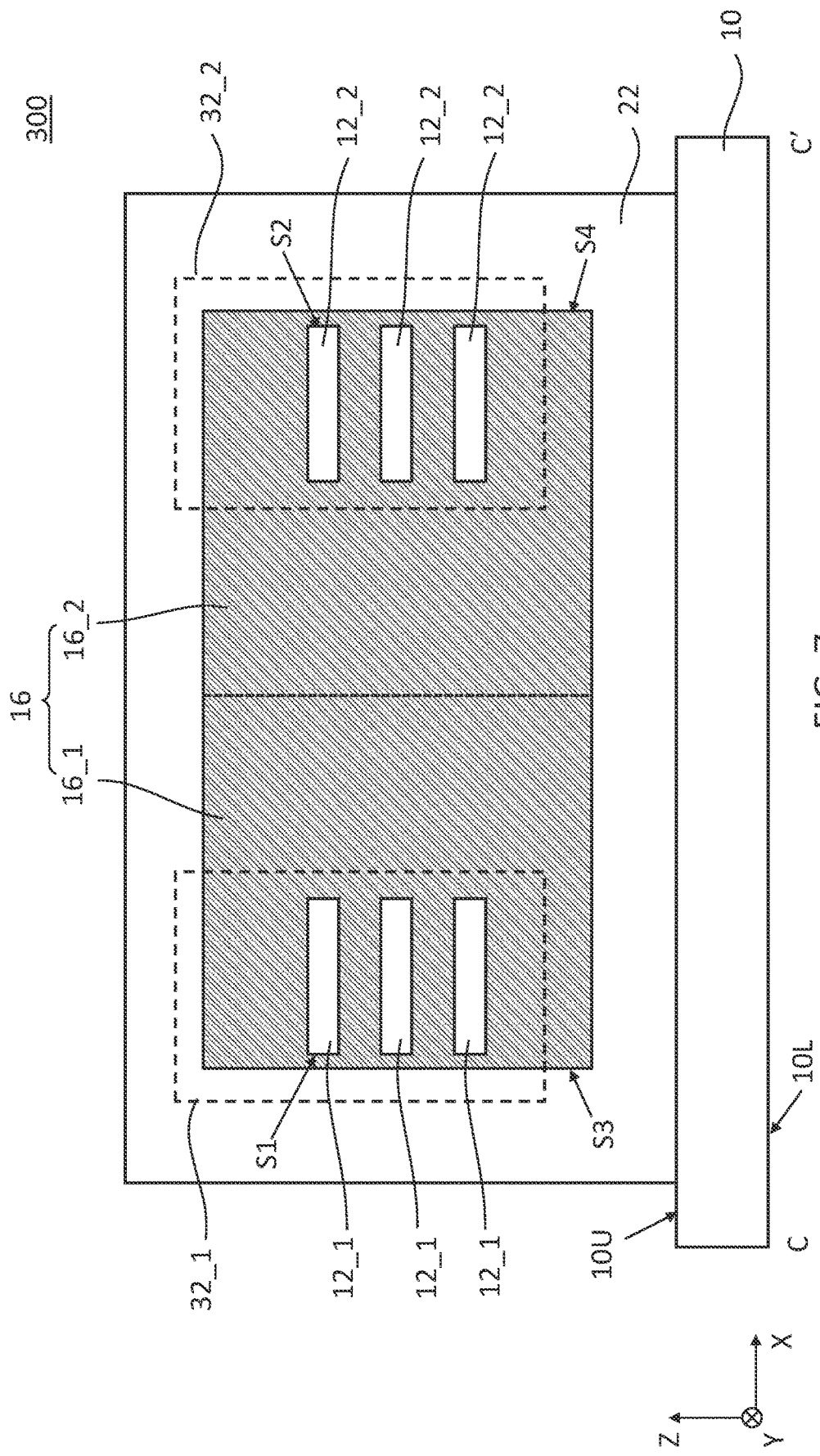
FIG. 7 is a cross-sectional view of the integrated circuit device taken along the line C-C' in FIG. 6.

FIG. 6 is a layout of an integrated circuit device 300 according to some embodiments of the present invention, and FIG. 7 is a cross-sectional view of the integrated circuit device 300 taken along the line C-C' in FIG. 6.

The integrated circuit device 300 is similar to the integrated circuit device 100 with a primary difference being that the gate electrode 16 covers both the first surface S1 of the first channel layer 12_1 and the second surface S2 of the second channel layer 12_2. In some embodiments, the gate electrode 16 may completely enclose the first channel layer 12_1 and the second channel layer 12_2 as illustrated in FIG. 7. Accordingly, the third surface S3 of the gate electrode 16 may not be coplanar with the first surface S1 of the first channel layer 12_1, and the fourth surface S4 of the gate electrode 16 may not be coplanar with the second surface S2 of the second channel layer 12_2.

In the integrated circuit device 300, the third surface S3 of the gate electrode 16 may be spaced apart from the fourth surface S4 of the gate electrode 16 in the first direction by a third distance d3 that may be shorter than the second distance d2 between the first outer surface OS1 of the first source/drain region 32_1 and the second outer surface OS2 of the second source/drain region 32_2 in the first direction as illustrated in FIG. 6.

The first source/drain region 32_1 may include a first portion 32_1p' that does not overlap the gate electrode 16 in the second direction, and the second source/drain region 32_2 may include a second portion 32_2p' that does not overlap the gate electrode 16. The first portion 32_1p' and the second portion 32_2p', therefore, may not contribute to a parasitic capacitance with the gate electrode 16.

Figure 8:
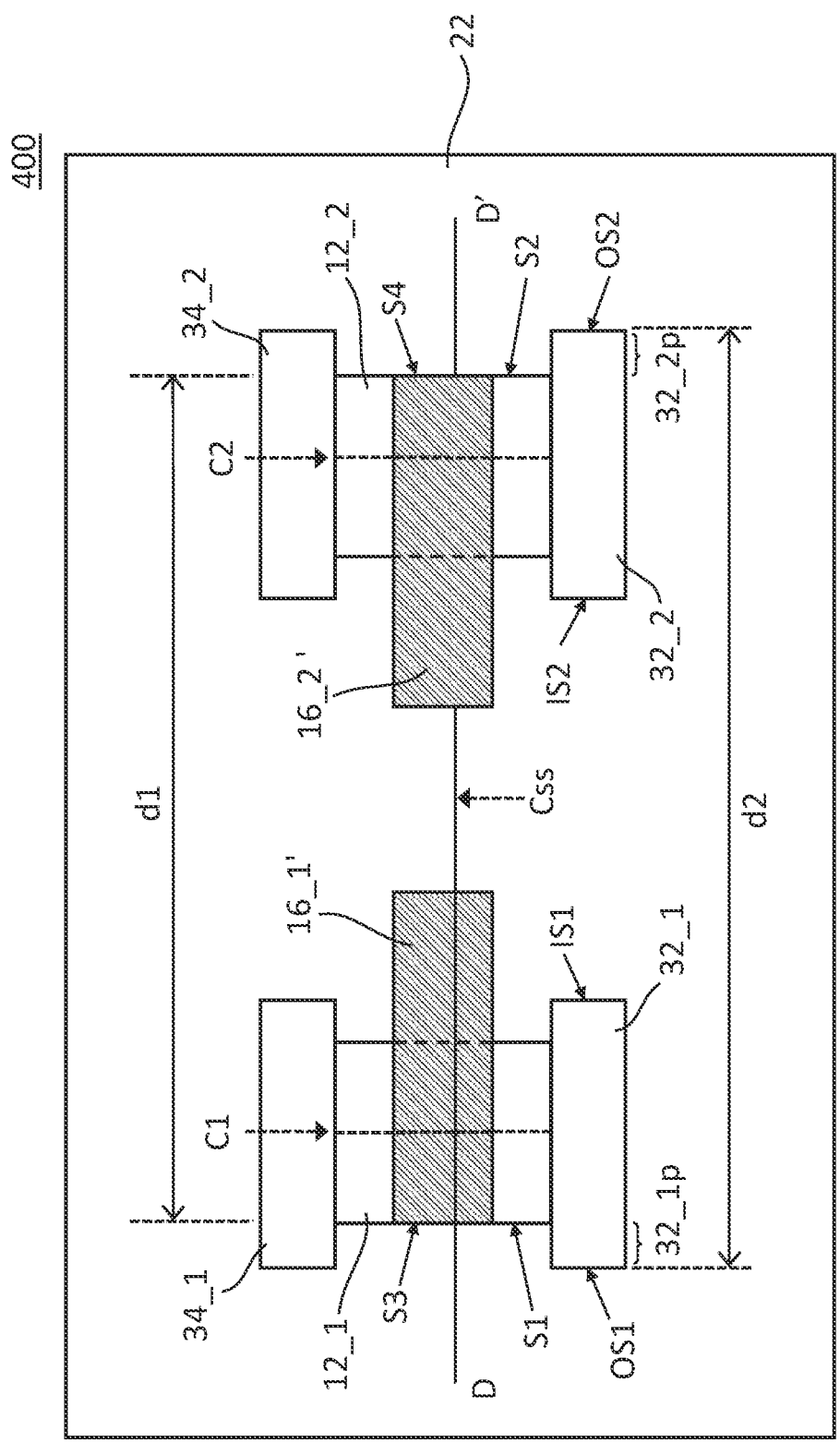
FIG. 8 is a layout of an integrated circuit device according to some embodiments of the present invention.
Figure 9:
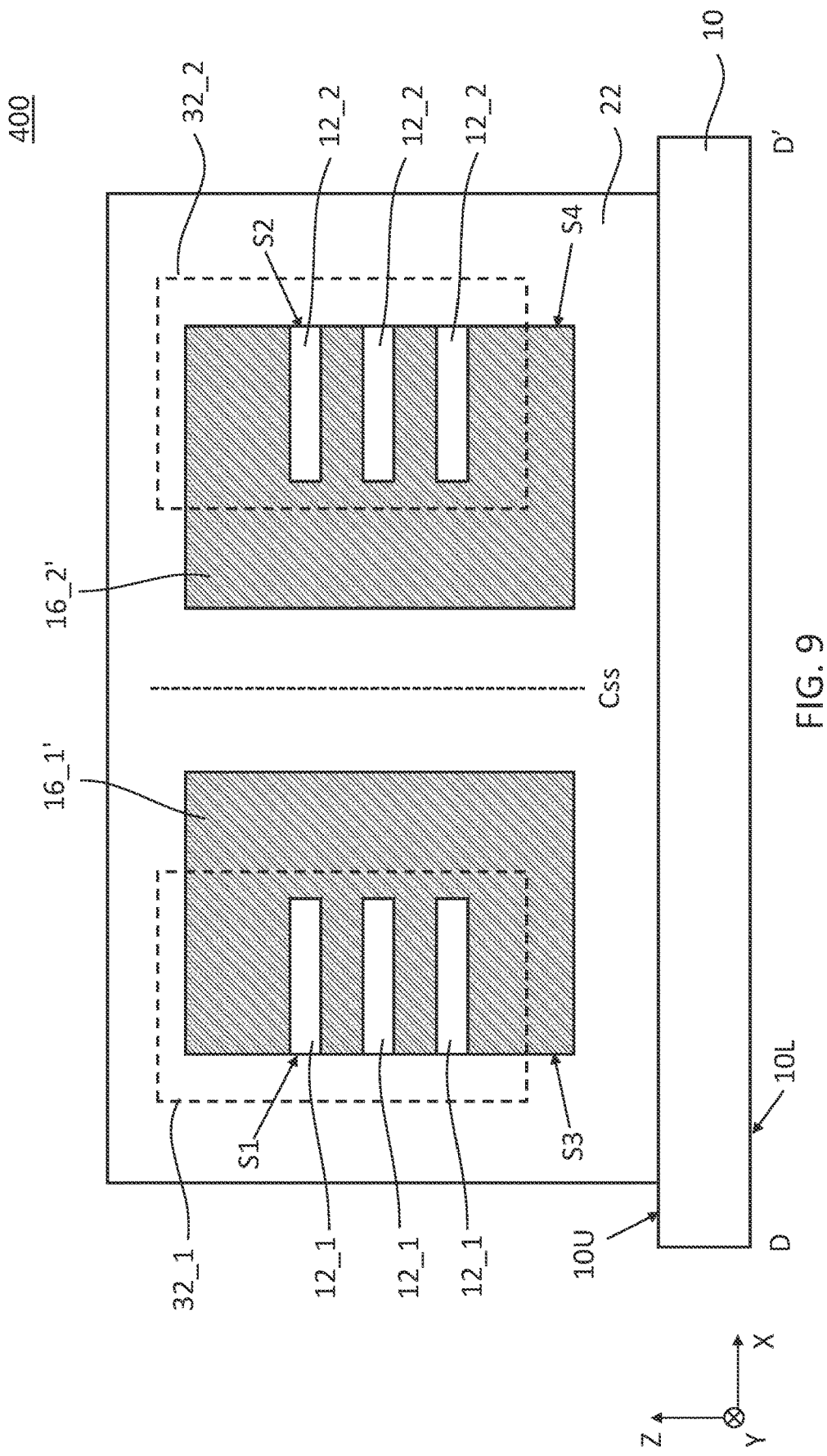
FIG. 9 is a cross-sectional view of the integrated circuit device taken along the line D-D' in FIG. 8.

FIG. 8 is a layout of an integrated circuit device 400 according to some embodiments of the present invention, and FIG. 9 is a cross-sectional view of the integrated circuit device 400 taken along the line D-D' in FIG. 8.

The integrated circuit device 400 is similar to the integrated circuit device 100 with a primary difference being that a first gate electrode 16_1' and a second gate electrode 16_2' are provided instead of the single gate electrode 16. The first channel layer 12_1 may be provided in the first gate electrode 16_1', and the second channel layer 12_2 may be provided in the second gate electrode 16_2'. The first gate electrode 16_1' may include the third surface S3, and the second gate electrode 16_2' may include a fourth surface S4. The first gate electrode 16_1' and the second gate electrode 16_2' may be spaced apart from each other in the first direction, and a portion of the insulating layer 22 may separate the first gate electrode 16_1' and the second gate electrode 16_2' from each other. The first gate electrode 16_1' and the second gate electrode 16_2' may include the same material or different materials. Although not shown, in some embodiments, the integrated circuit device 400 may further include conductive element(s) (e.g., a via contact and/or a conductive wire) that electrically connect the first gate electrode 16_1' and the second gate electrode 16_2'.

In some embodiments, the first center C1 of the first channel layer 12_1 in the first direction may be closer to the third surface S3 of the first gate electrode 16_1' than a center Css between the third surface S3 of the first gate electrode 16_1' and the fourth surface S4 of the second gate electrode 16_2' in the first direction, and the second center C2 of the second channel layer 12_2 may be closer to the fourth surface S4 of the second gate electrode 16_2' than the center Css between the third surface S3 of the first gate electrode 16_1' and the fourth surface S4 of the second gate electrode 16_2' in the first direction as illustrated in FIG. 8.

It will be understood that the integrated circuit devices 200 and 300 may also be modified to include a first gate electrode 16_1' and a second gate electrode 16_2' instead of the single gate electrode 16.

Figure 10:
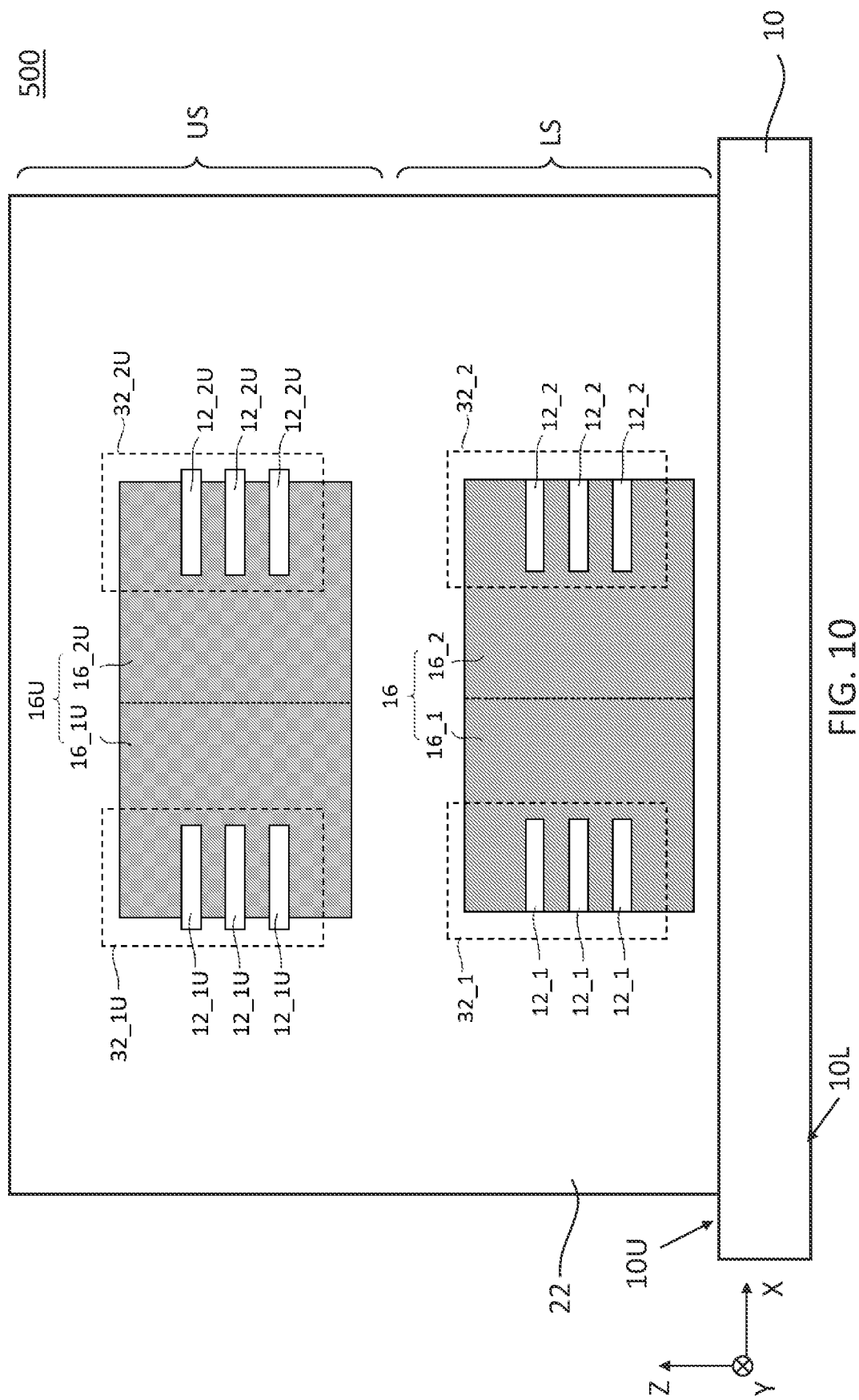
FIG. 10 is a cross-sectional view of an integrated circuit device according to some embodiments of the present invention.

FIG. 10 is a cross-sectional view of an integrated circuit device 500, taken along a longitudinal direction of a gate electrode (e.g., a gate electrode 16 or an upper gate electrode 16U), according to some embodiments of the present invention. Outlines of source/drain regions (i.e., first and second source/drain regions 32_1 and 32_2 and first and second upper source/drain regions 32_1U and 32_2U) are shown in FIG. 10 to show spatial relationships between those source/drain regions and other elements.

The integrated circuit device 500 may include a lower structure LS and an upper structure US. Each of the lower structure LS and the upper structure US may include transistors similar to any one of the transistors of the integrated circuit devices 100, 200, 300 and 400. For example, the lower structure LS may include transistors similar to the transistors of the integrated circuit device 100, and the upper structure US may include transistors similar to the transistors of the integrated circuit device 200.

The upper structure US may include an upper gate electrode 16U that includes a first portion 16_1U and a second portion 16_2U. The upper structure US may also include a first upper channel layer 12_1U and a second upper channel layer 12_2U. The first upper channel layer 12_1U may be in the first portion 16_1U of the upper gate electrode 16U, and the second upper channel layer 12_2U may be in the second portion 16_2U of the upper gate electrode 16U. The upper structure US may further include a first upper source/drain region 32_1U that may be spaced apart from the upper gate electrode 16U in the second direction and may contact the first upper channel layer 12_1U and may also include a second upper source/drain region 32_2U that may be spaced apart from the upper gate electrode 16U in the second direction and may contact the second upper channel layer 12_2U.

Figure 11:
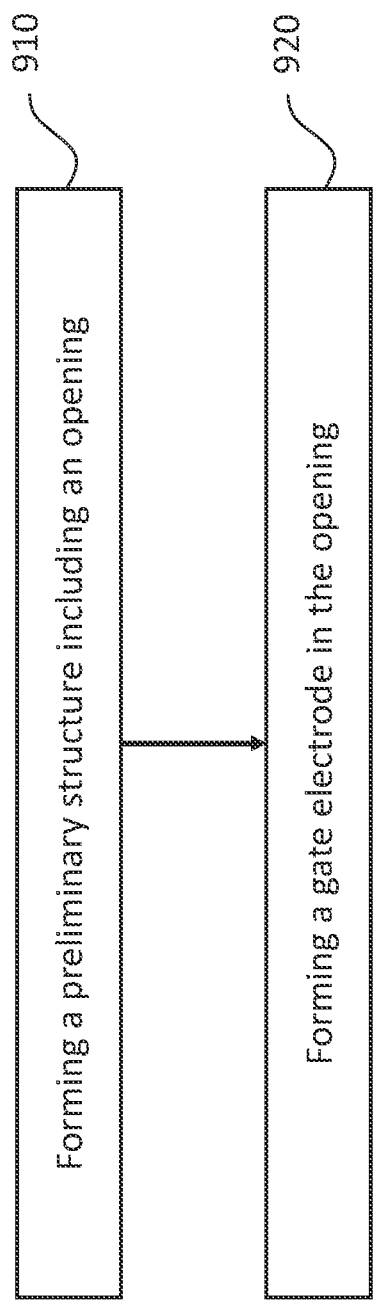
FIGS. 11, 12 and 13 are flowcharts of methods of forming an integrated circuit device according to some embodiments of the present invention.
Figure 12:
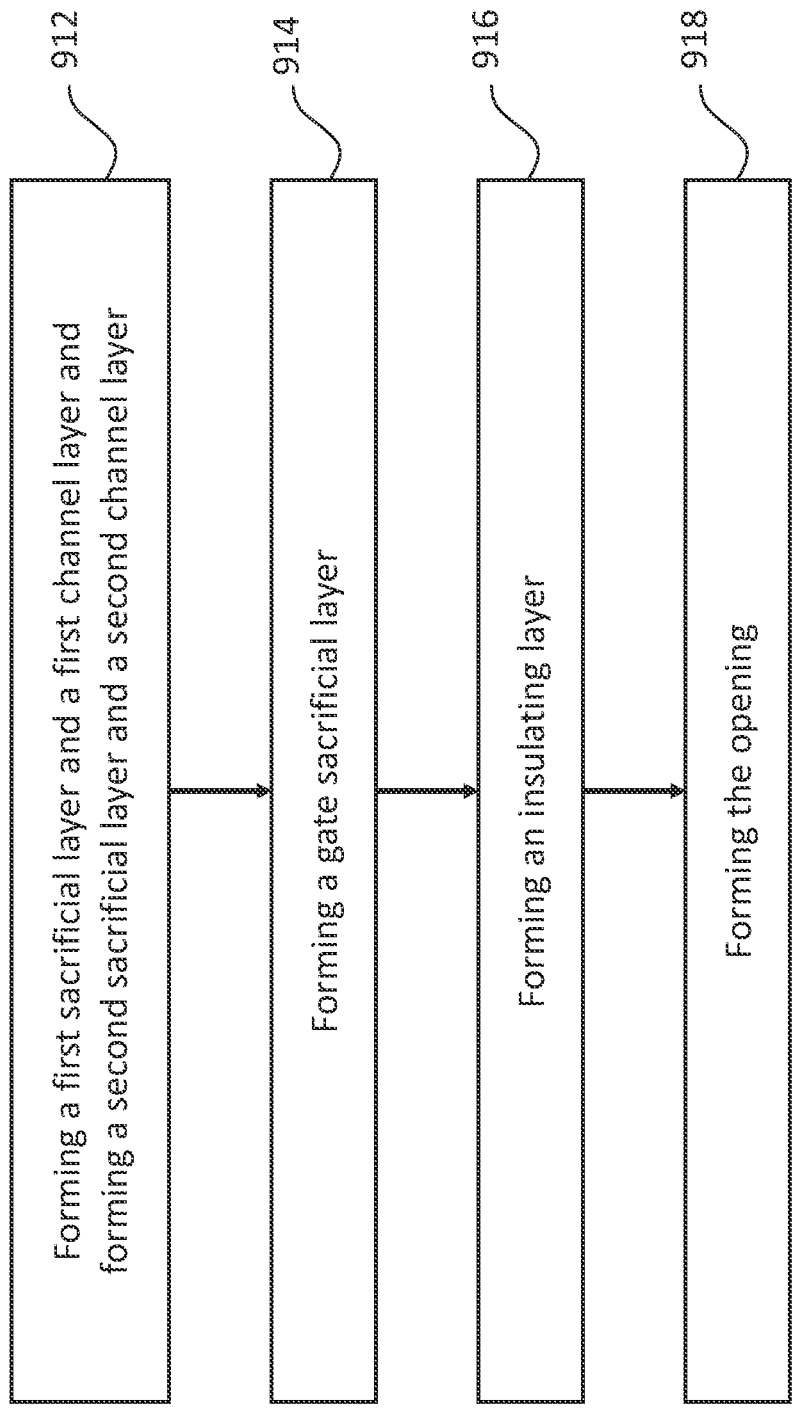
Figure 13:
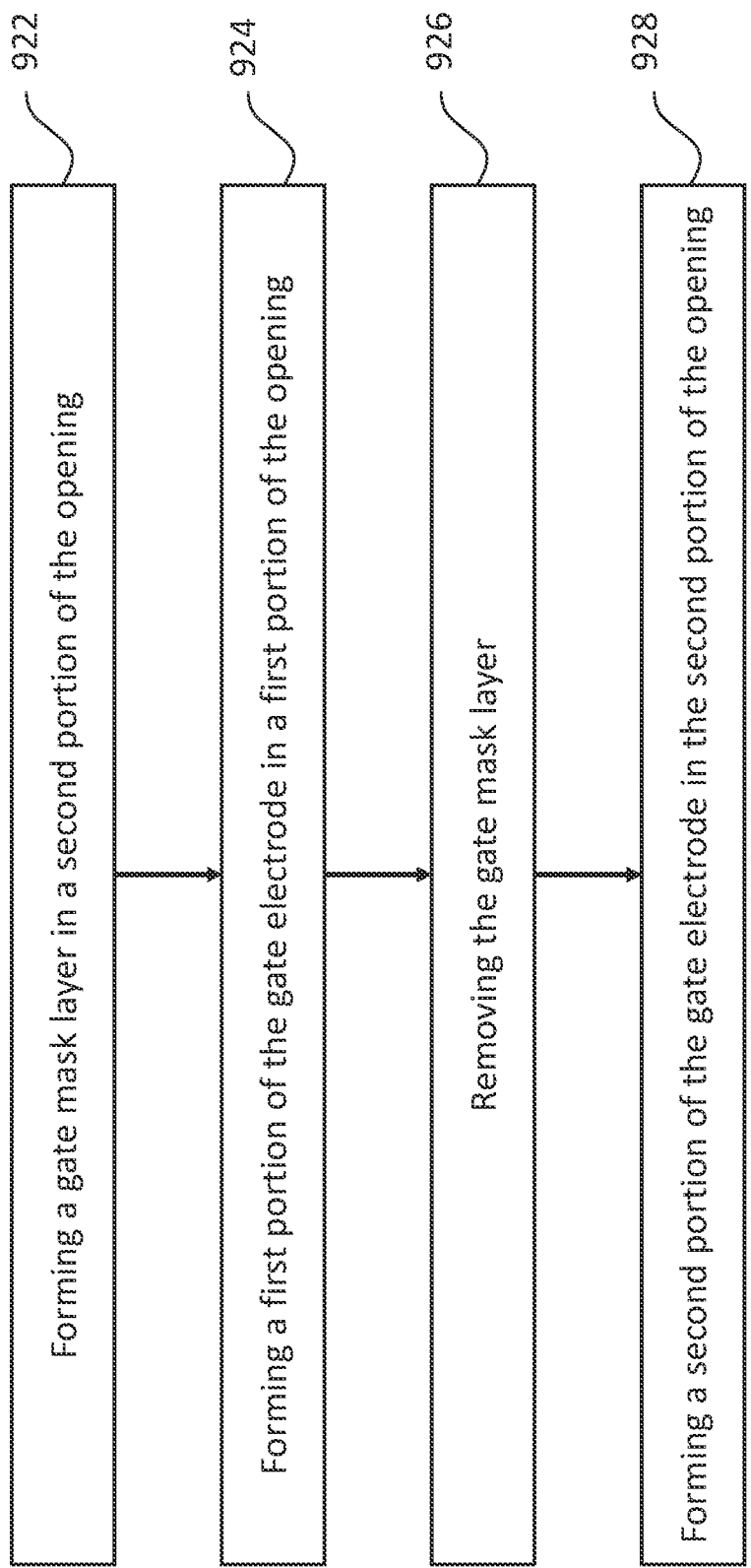

FIGS. 11, 12 and 13 are flowcharts of methods of forming an integrated circuit device according to some embodiments of the present invention, and FIGS. 14 to 21 are cross-sectional views, taken along a longitudinal direction of a gate electrode (e.g., a gate electrode 16 in FIG. 1), illustrating methods forming an integrated circuit device according to some embodiments of the present invention.

Referring to FIG. 11, the methods may include forming a preliminary structure including an opening (e.g., an opening 22o in FIG. 18) (Block 910) and forming a gate electrode (e.g., a gate electrode 16 in FIG. 21) in the opening (Block 920).

Figure 14:
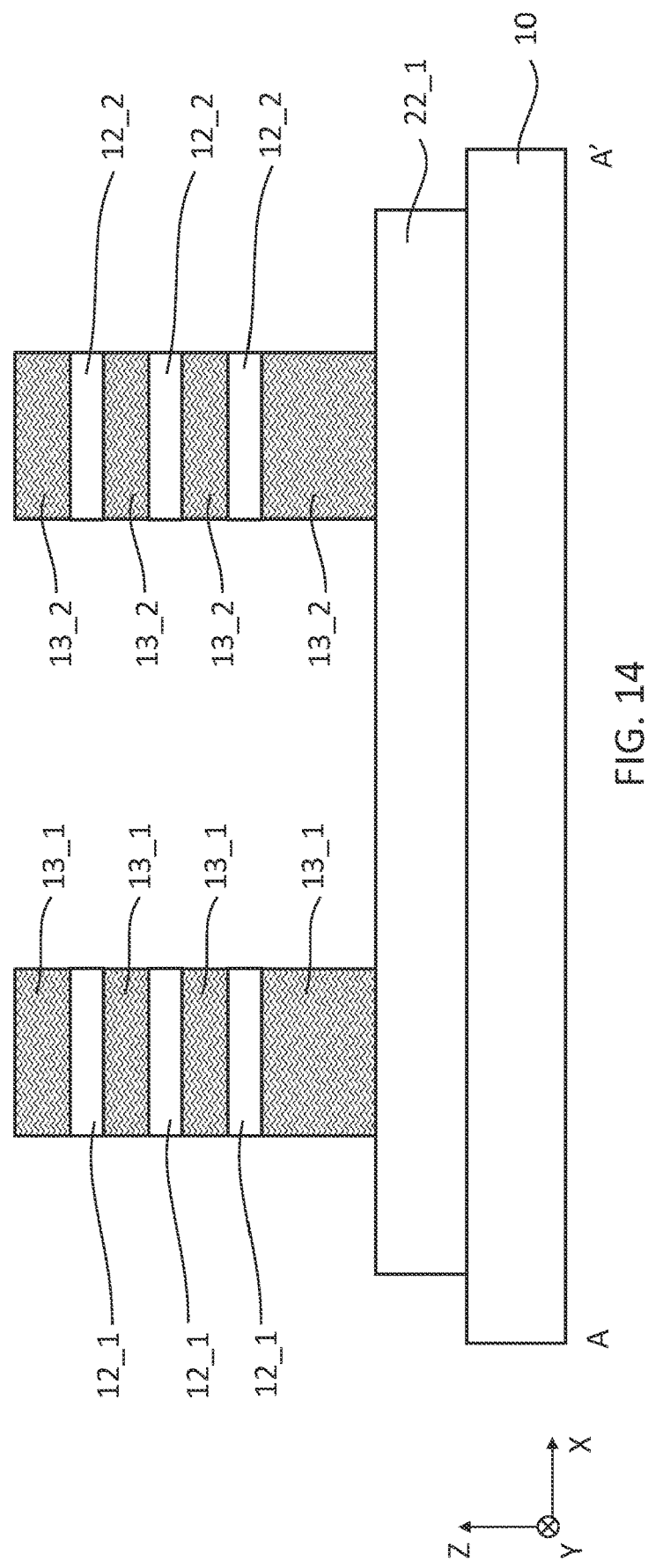
FIGS. 14 to 21 are cross-sectional views illustrating methods of forming an integrated circuit device according to some embodiments of the present invention.

Referring to FIG. 12 and FIG. 14, forming the preliminary structure including the opening may include forming a first sacrificial layer 13_1 and a first channel layer 12_1 and forming a second sacrificial layer 13_2 and a second channel layer 12_2 on a substrate 10 (Block 912). In some embodiments, multiple first channel layers 12_1 may be alternately stacked with multiple first sacrificial layers 13_1 in the third direction, and multiple first channel layers 12_2 may be alternately stacked with multiple second sacrificial layers 13_2 as illustrated in FIG. 14. A first portion 22_1 of an insulating layer 22 may be formed on the substrate 10 before forming the first channel layer 12_1, the first sacrificial layer 13_1, the second channel layer 12_2 and the second sacrificial layer 13_2. Although FIG. 14 illustrates that the lowermost first sacrificial layer 13_1 is between the lowermost first channel layer 12_1 and the substrate 10, and the lowermost second sacrificial layer 13_2 is between the lowermost second channel layer 12_2 and the substrate 10, the present invention is not limited thereto. The stacking sequence may be varied.

Each of the first sacrificial layer 13_1 and the second sacrificial layer 13_2 may have an etch selectivity with respect to the first and second channel layers 12_1 and 12_2. Each of the first sacrificial layer 13_1 and the second sacrificial layer 13_2 may include, for example, semiconductor material(s) (e.g., silicon, germanium, silicon-germanium, and/or a Group semiconductor compound). The first portion 22_1 of the insulating layer 22 may include, for example, silicon oxide, silicon nitride, silicon oxynitride, silicon carbide and/or a low k material.

Figure 15:
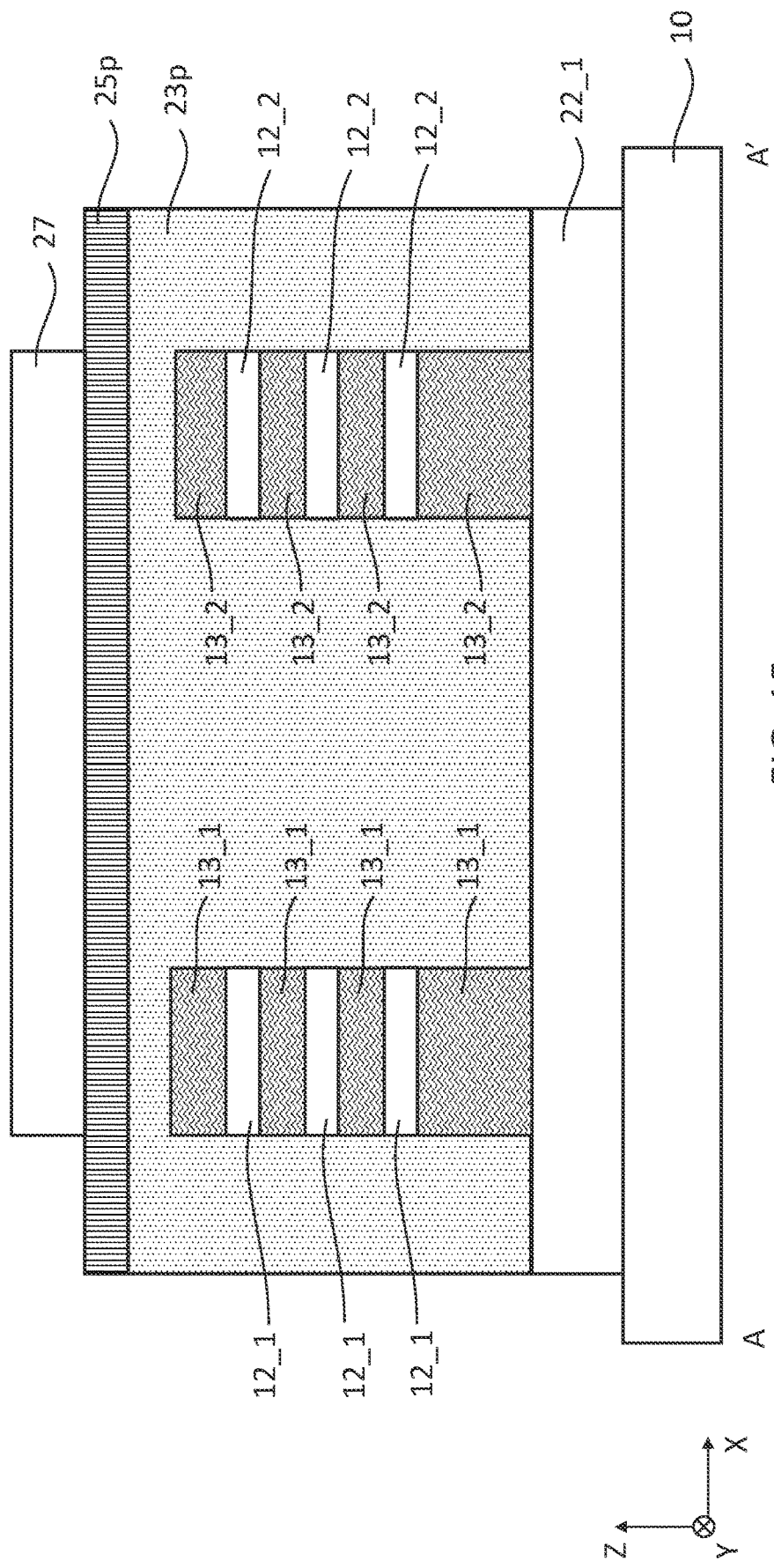

Referring to FIG. 15, a preliminary gate sacrificial layer 23p, a preliminary first mask layer 25p and a second mask layer 27 may be sequentially formed on the first channel layer 12_1, the first sacrificial layer 13_1, the second channel layer 12_2, and the second sacrificial layer 13_2. In some embodiments, the preliminary first mask layer 25p may be omitted. In some embodiments, the preliminary gate sacrificial layer 23p may contact the first channel layer 12_1, the first sacrificial layer 13_1, the second channel layer 12_2, and the second sacrificial layer 13_2.

The preliminary gate sacrificial layer 23p may include a material having an etch selectivity with respect to the first channel layer 12_1, the first sacrificial layer 13_1, the second channel layer 12_2, the second sacrificial layer 13_2, and the first portion 22_1 of the insulating layer 22 and may include, for example, poly silicon. The preliminary first mask layer 25p may be, for example, a hard mask layer including a silicon nitride layer. In some embodiments, the preliminary first mask layer 25p may include a silicon nitride layer and a silicon oxide layer sequentially stacked on the preliminary gate sacrificial layer 23p. The second mask layer 27 may be, for example, a photoresist layer.

Figure 16:
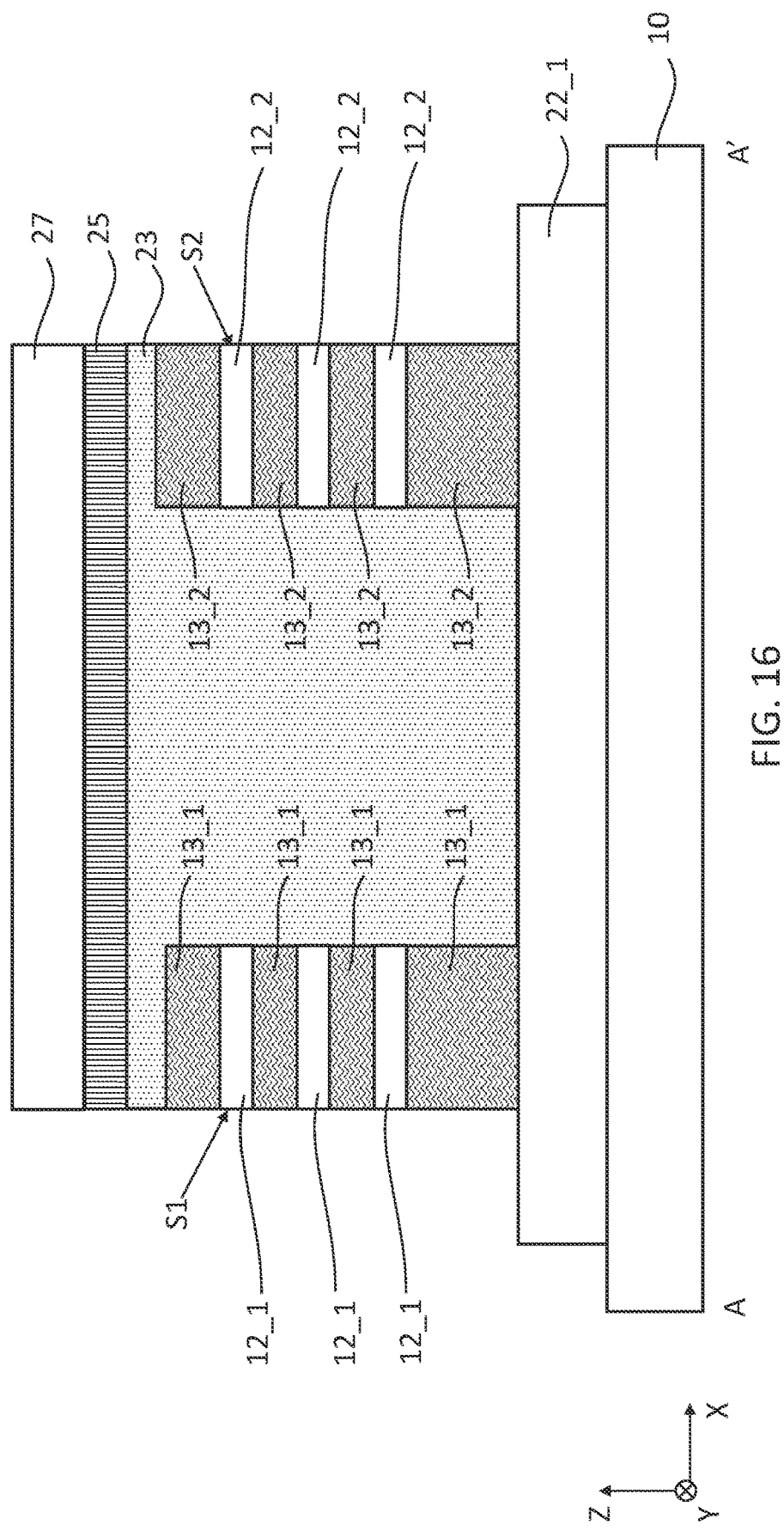

Referring to FIG. 12 and FIG. 16, the preliminary gate sacrificial layer 23p and the preliminary first mask layer 25p may be etched using the second mask layer 27 as an etch mask to expose the first surface S1 of the first channel layer 12_1 and the second surface S2 of the second channel layer 12_2. Opposing side surfaces of the second mask layer 27 may be coplanar with the first surface S1 of the first channel layer 12_1 and the second surface S2 of the second channel layer 12_2, respectively. Various processes (e.g., a dry etch process and/or a wet etch process) may be used to etch the preliminary gate sacrificial layer 23p and the preliminary first mask layer 25p thereby forming a gate sacrificial layer 23 between the first channel layer 12_1 and the second channel layer 12_2 (Block 914). In some embodiments, a first mask layer 25 may be formed on the gate sacrificial layer 23. The second mask layer 27 may be removed after the gate sacrificial layer 23 is formed.

Figure 17:
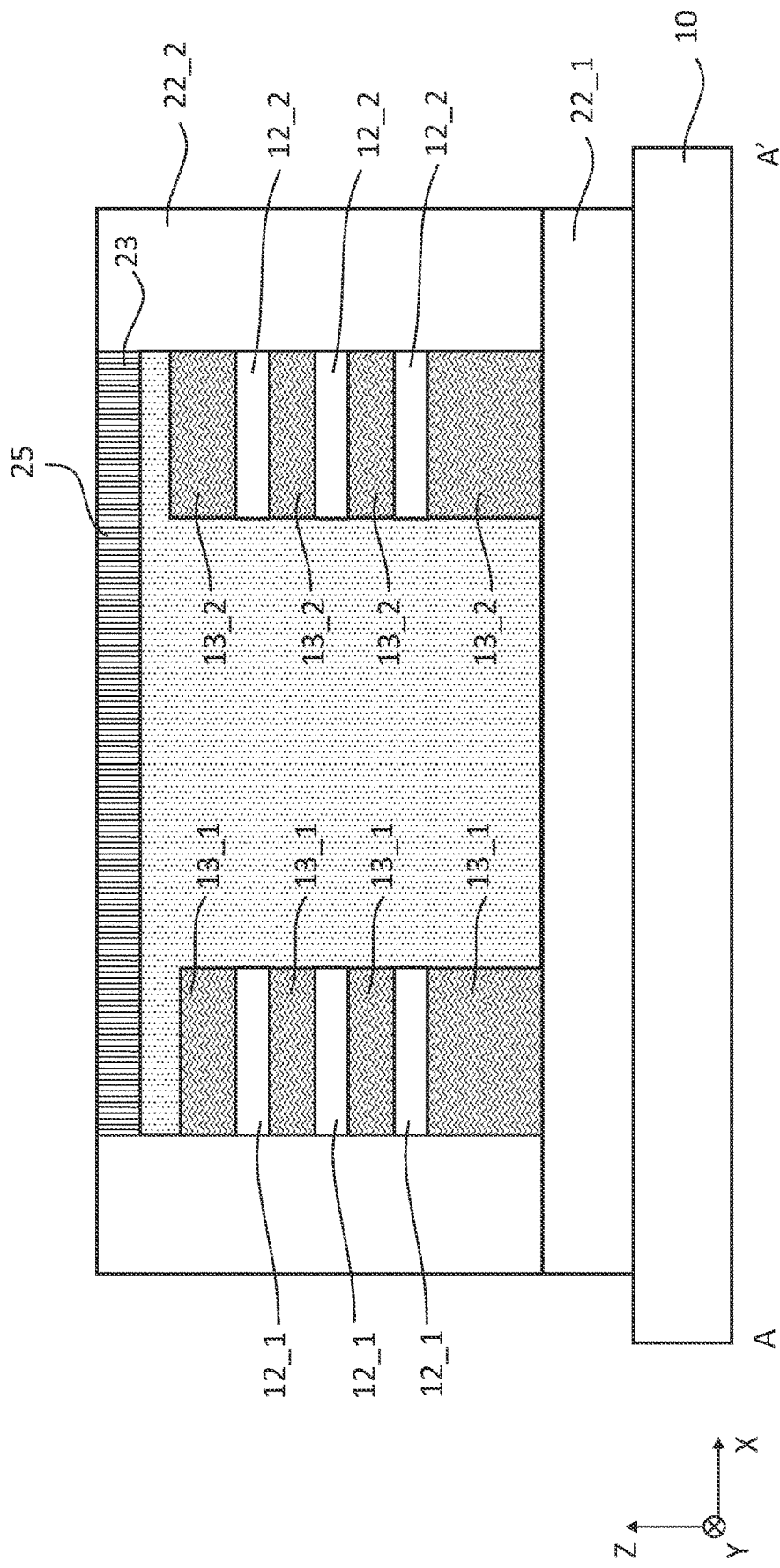

Referring to FIG. 12 and FIG. 17, a second portion 22_2 of the insulating layer 22 may be formed on the gate sacrificial layer 23 and the first mask layer 25 (Block 916). A preliminary insulating layer covering the first mask layer 25 may be formed and then a planarization process (e.g., a polishing process, a dry etch process and/or a wet etch process) may be performed so as to expose the first mask layer 25. The second portion 22_2 of the insulating layer 22 may include, for example, silicon oxide, silicon nitride, silicon oxynitride, silicon carbide and/or a low k material.

Figure 18:
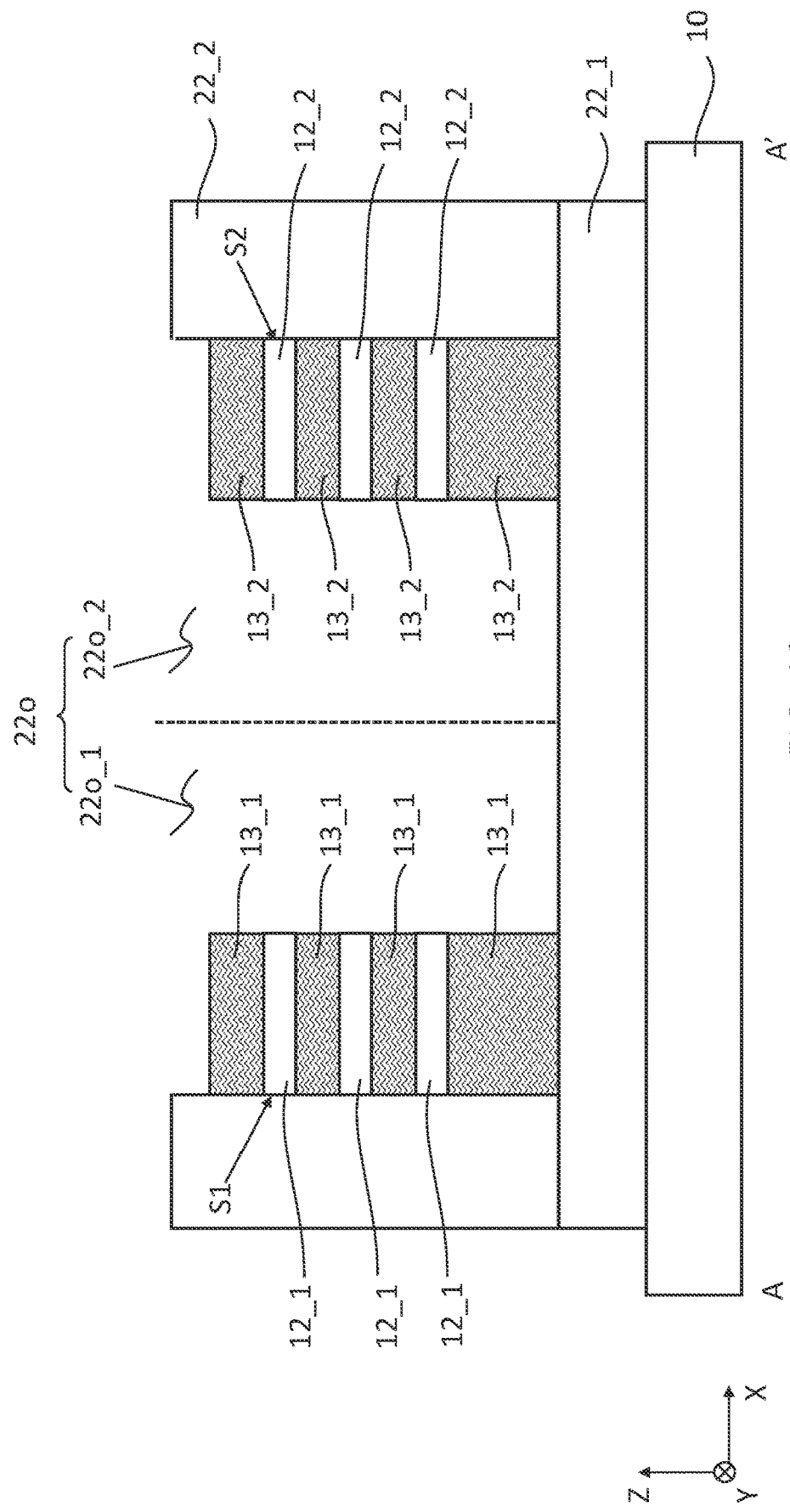

Referring to FIG. 12 and FIG. 18, the first mask layer 25 and the gate sacrificial layer 23 may be removed thereby forming an opening 22o (Block 918). Various processes (e.g., a dry etch process and/or a wet etch process) may be used to remove the first mask layer 25 and the gate sacrificial layer 23. The opening 22o may expose the first channel layer 12_1, the first sacrificial layer 13_1, the second channel layer 12_2, and the second sacrificial layer 13_2.

Figure 19:
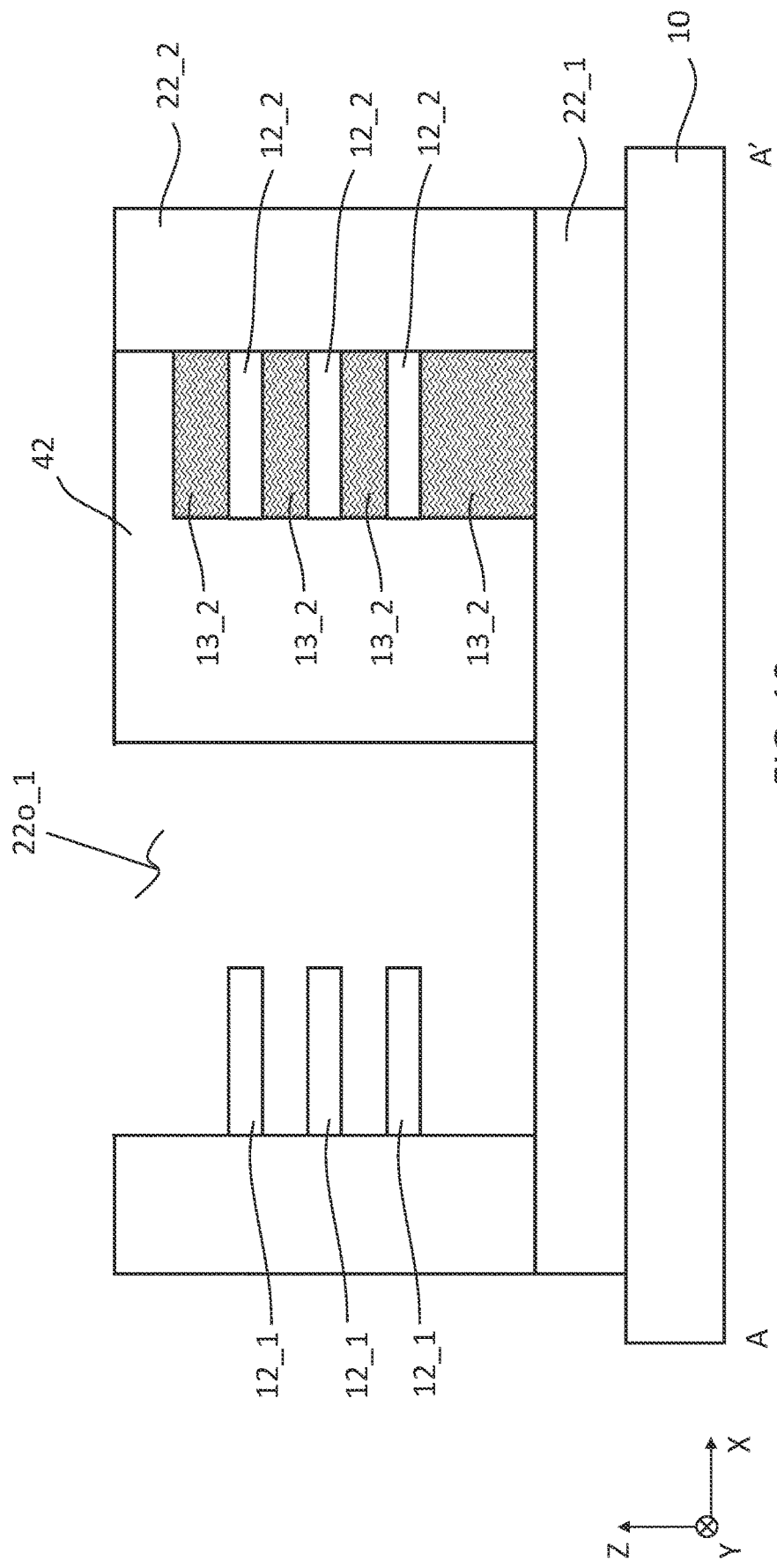

Referring to FIG. 13 and FIG. 19, the methods may include forming a gate mask layer 42 in a second portion 22o_2 of the opening 22o (Block 922). A preliminary gate mask layer may be formed in both a first portion 22o_1 and the second portion 22o_2 of the opening 22o and then a portion of the preliminary gate mask layer formed in the first portion 22o_1 of the opening 22o may be removed thereby forming the gate mask layer 42 in the second portion 22o_2 of the opening 22o. The first sacrificial layer 13_1 may be removed thereby exposing all surfaces, except the first surface S1, of the first channel layer 12_1.

The gate mask layer 42 may include a material having an etch selectivity with respect to the first and second channel layers 12_1 and 12_2 and the first and second portions 22_1 and 22_2 of the insulating layer 22. The gate mask layer 42 may include, for example, silicon oxide, silicon nitride, silicon oxynitride, silicon carbide and/or a low k material.

Figure 20:
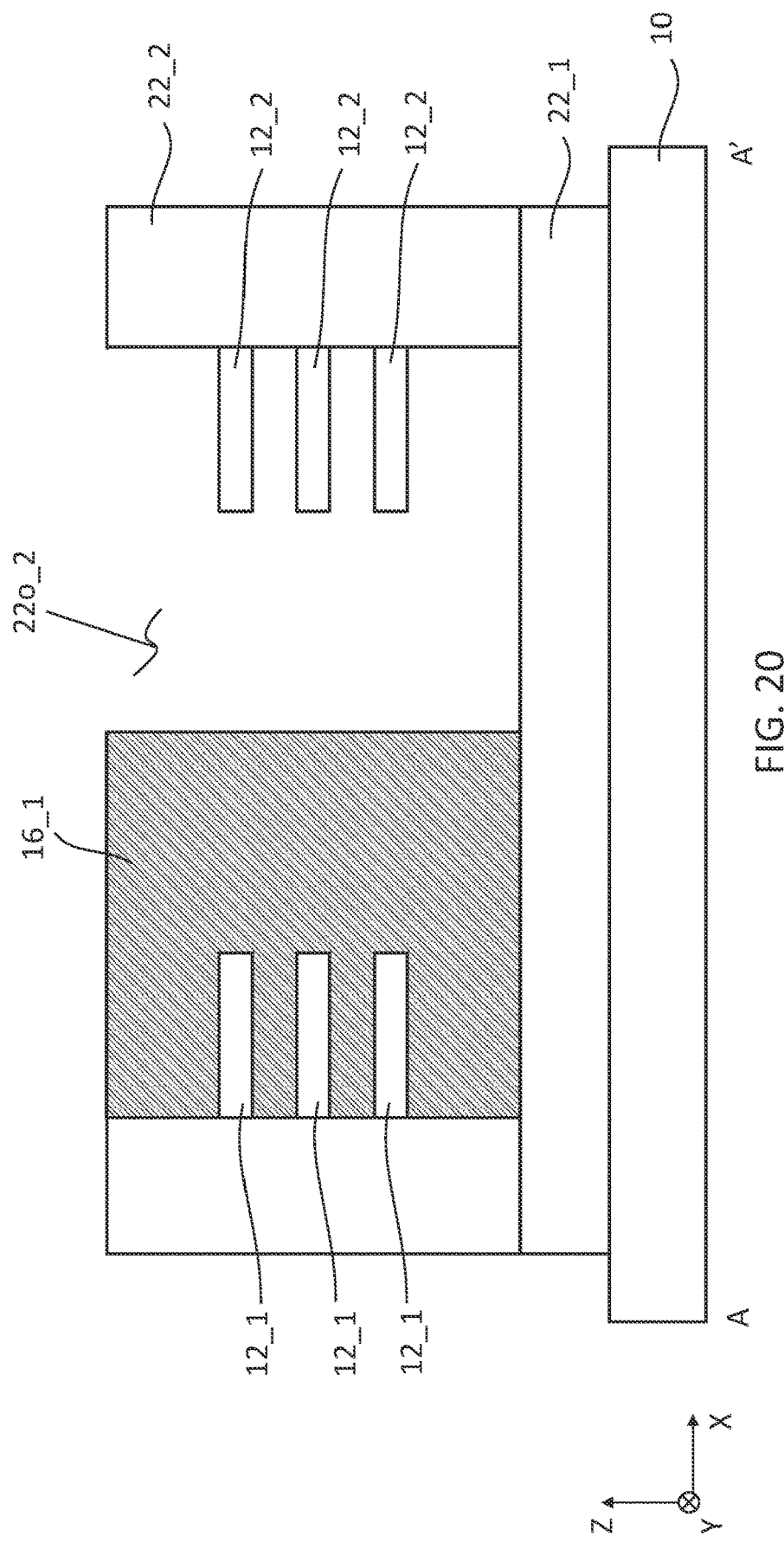

Referring to FIG. 13 and FIG. 20, the methods may include forming a first portion 16_1 of the gate electrode 16 in the first portion 22o_1 of the opening 22o (Block 924). The first portion 16_1 of the gate electrode 16 may include a first gate work function layer (e.g., the first gate work function layer 16w_1 in FIG. 3) and a first main gate layer (e.g., the first main gate layer 16m_1 in FIG. 3), which are sequentially formed on the first channel layer 12_1. Further, a first gate insulating layer (e.g., the first gate insulating layer 11_1 in FIG. 3) may be formed on the first channel layer 12_1 before the first portion 16_1 of the gate electrode 16 is formed. The gate mask layer 42 may be removed from the second portion 22o_2 of the opening 22o (Block 926). Various processes (e.g., a dry etch process and/or a wet etch process) may be used to remove the gate mask layer 42.

Figure 21:
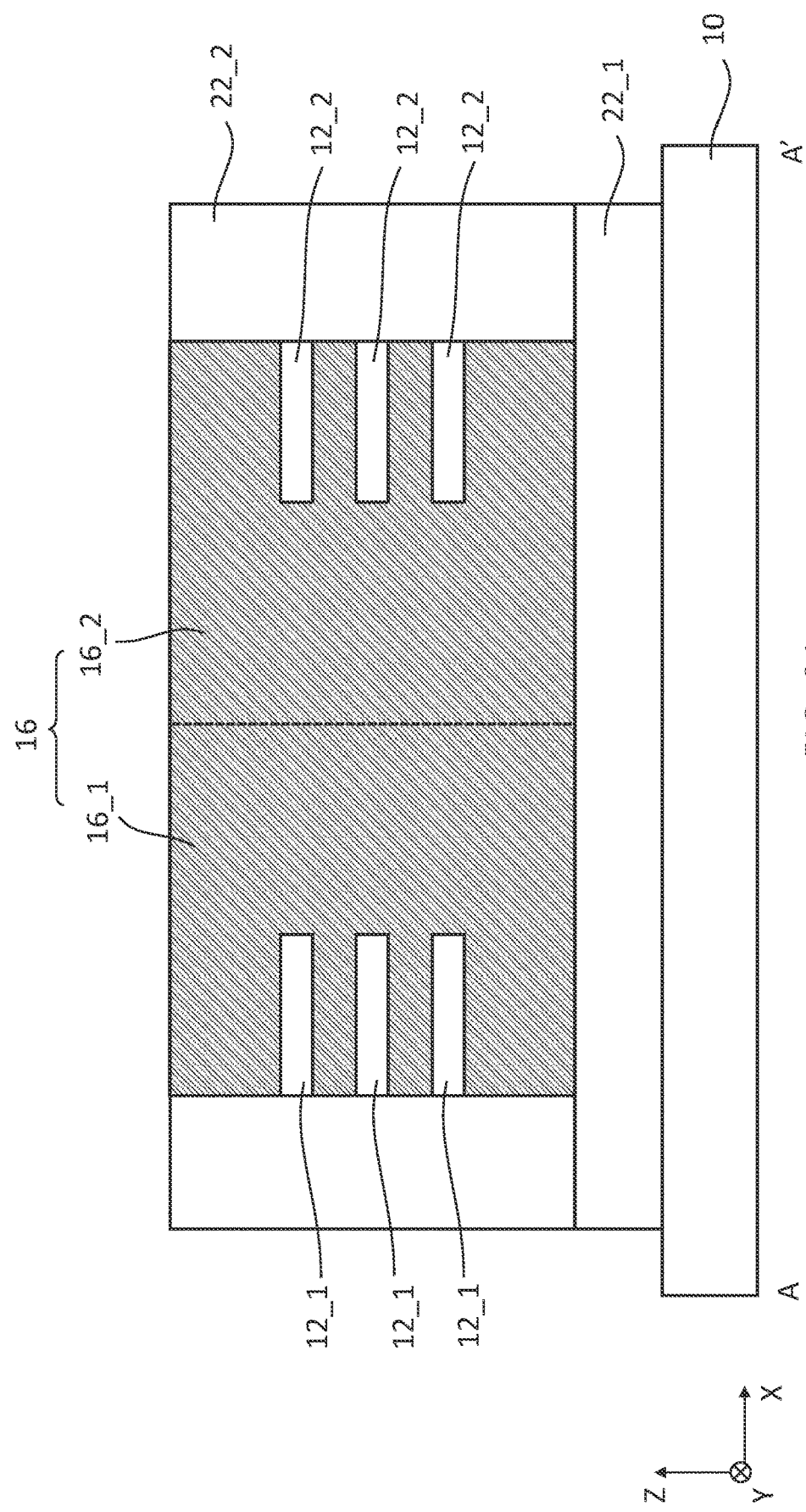

Referring to FIG. 13 and FIG. 21, the methods may include forming a second portion 16_2 of the gate electrode 16 in the second portion 22o_2 of the opening 22o (Block 928). The second portion 16_2 of the gate electrode 16 may include a second gate work function layer (e.g., the second gate work function layer 16w_2 in FIG. 3) and a second main gate layer (e.g., the second main gate layer 16m_2 in FIG. 3), which are sequentially formed on the second channel layer 12_2. Further, a second gate insulating layer (e.g., the second gate insulating layer 11_2 in FIG. 3) may be formed on the second channel layer 12_2 before the second portion 16_2 of the gate electrode 16 is formed.

In some embodiments, the first portion 16_1 and the second portion of 16_2 of the gate electrodes 16 may be formed concurrently in the opening 22o after the preliminary structure is formed. The first and second gate work function layers may be formed concurrently on the first channel layer 12_1 and the second channel layer 12_2 and may include the same material. The first and second gate work function layers may have the same thickness. The first and second main gate layers may be formed concurrently on the first gate work function layer and the second gate work function layer and may include the same material.

Figure 22:
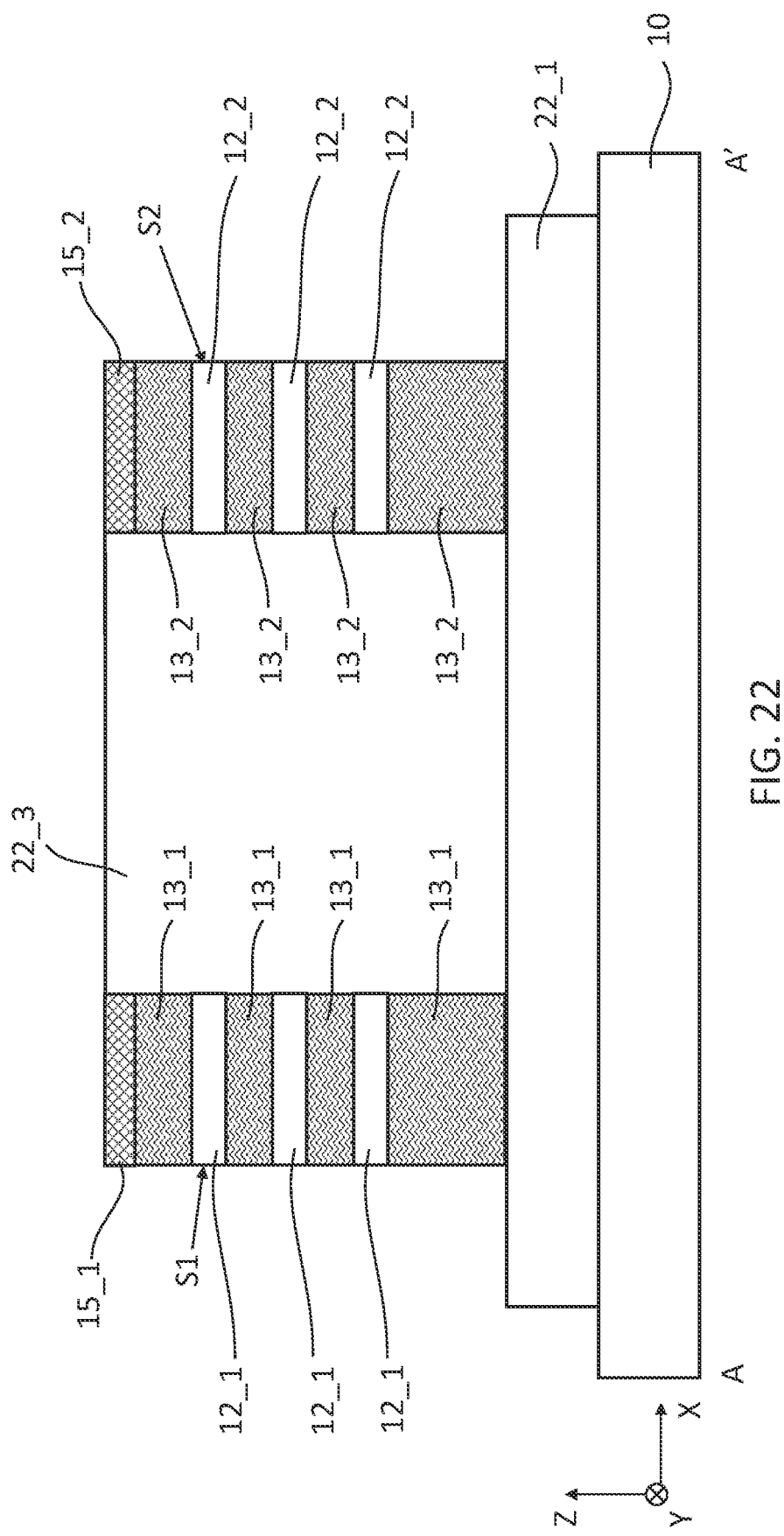
FIGS. 22 to 27 are cross-sectional views illustrating methods of forming a preliminary structure according to some embodiments of the present invention.

FIGS. 22 to 27 are cross-sectional views illustrating methods of forming a preliminary structure according to some embodiments of the present invention (Block 910 in FIG. 11). Referring to FIG. 22, the first sacrificial layer 13_1, the first channel layer 12_1 and a first channel mask layer 15_1, which are stacked in the third direction, and the second sacrificial layer 13_2, the second channel layer 12_2 and a second channel mask layer 15_2, which are stacked in the third direction, may be provided on the substrate 10. Further, a third portion 22_3 of the insulating layer 22 may be formed between the first channel layer 12_1 and the second channel layer 12_2. In some embodiments, an upper surface of the third portion 22_3 of the insulating layer 22 may be coplanar with upper surfaces of the first channel mask layer 15_1 and the second channel mask layer 15_2 as illustrated in FIG. 22. The first surface S1 of the first channel layer 12_1 and the second surface S2 of the second channel layer 12_2 may be exposed.

Each of the first channel mask layer 15_1 and the second channel mask layer 15_2 may include, for example, silicon oxide, silicon nitride and/or silicon oxynitride. The third portion 22_3 of the insulating layer 22 may include, for example, silicon oxide, silicon nitride, silicon oxynitride, silicon carbide and/or a low k material.

Figure 23:
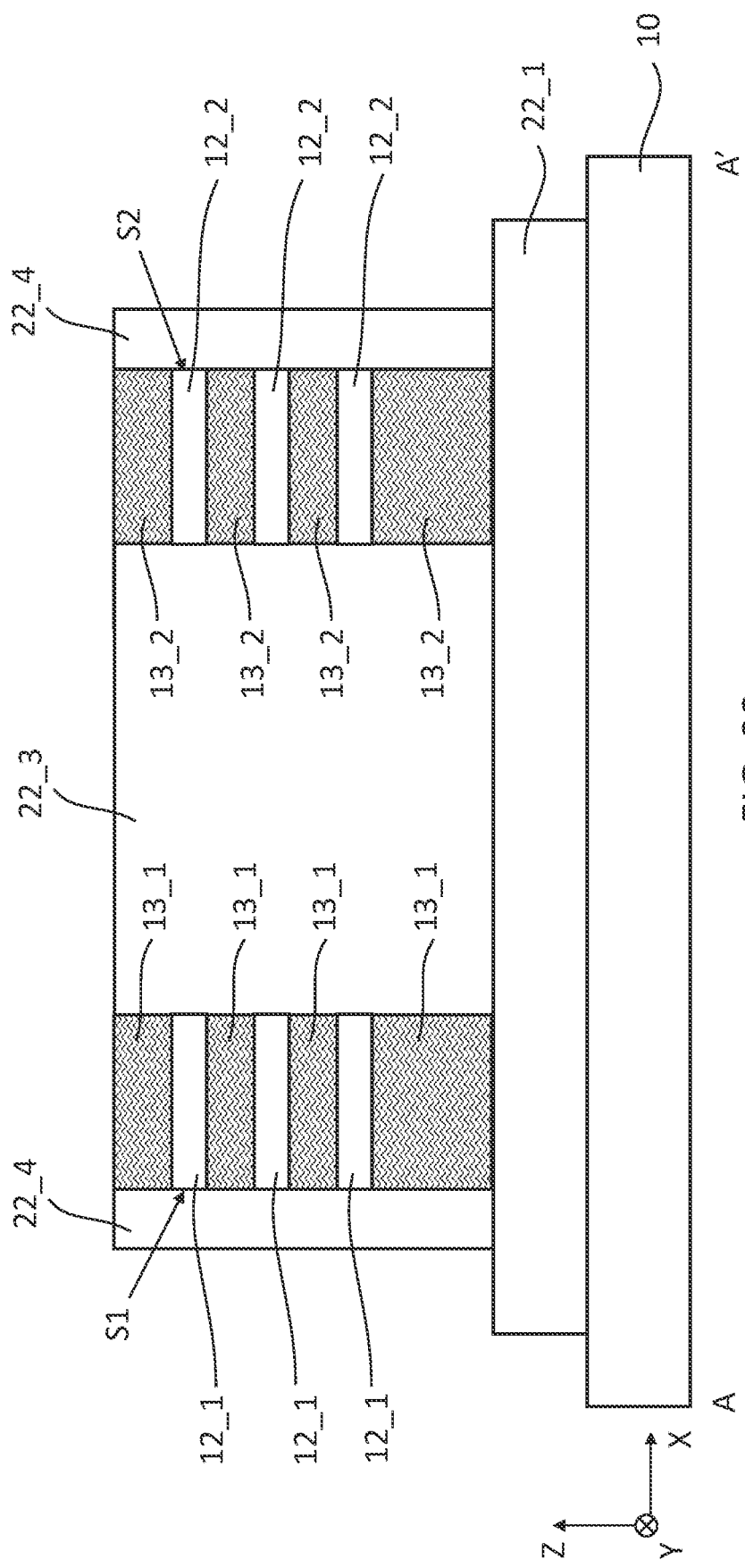

Referring to FIG. 23, fourth portions 22_4 of the insulating layer 22 may be formed on and may contact the first surface S1 of the first channel layer 12_1 and the second surface S2 of the second channel layer 12_2, respectively. The fourth portions 22_4 of the insulating layer 22 may also contact the first sacrificial layer 13_1 and the second sacrificial layer 13_2. The fourth portions 22_4 of the insulating layer 22 may be referred to as spacers. For example, a preliminary spacer layer may be conformally formed on the structure illustrated in FIG. 22 and then a process (e.g., anisotropic etch process) may be performed to expose the upper surfaces of the third portion 22_3 of the insulating layer 22, the first channel mask layer 15_1 and the second channel mask layer 15_2 thereby forming the fourth portions 22_4 of the insulating layer 22. In some embodiments, the first channel mask layer 15_1 and the second channel mask layer 15_2 may be removed while forming the fourth portions 22_4 of the insulating layer 22. The fourth portions 22_4 of the insulating layer 22 may include a material different from the first portion 22_1 of the insulating layer 22 and may have an etch selectivity with respect to the first portion 22_1 of the insulating layer 22. For example, the fourth portions 22_4 of the insulating layer 22 may include silicon nitride, silicon oxynitride, silicon carbide and/or silicoboron carbonitride.

Figure 24:
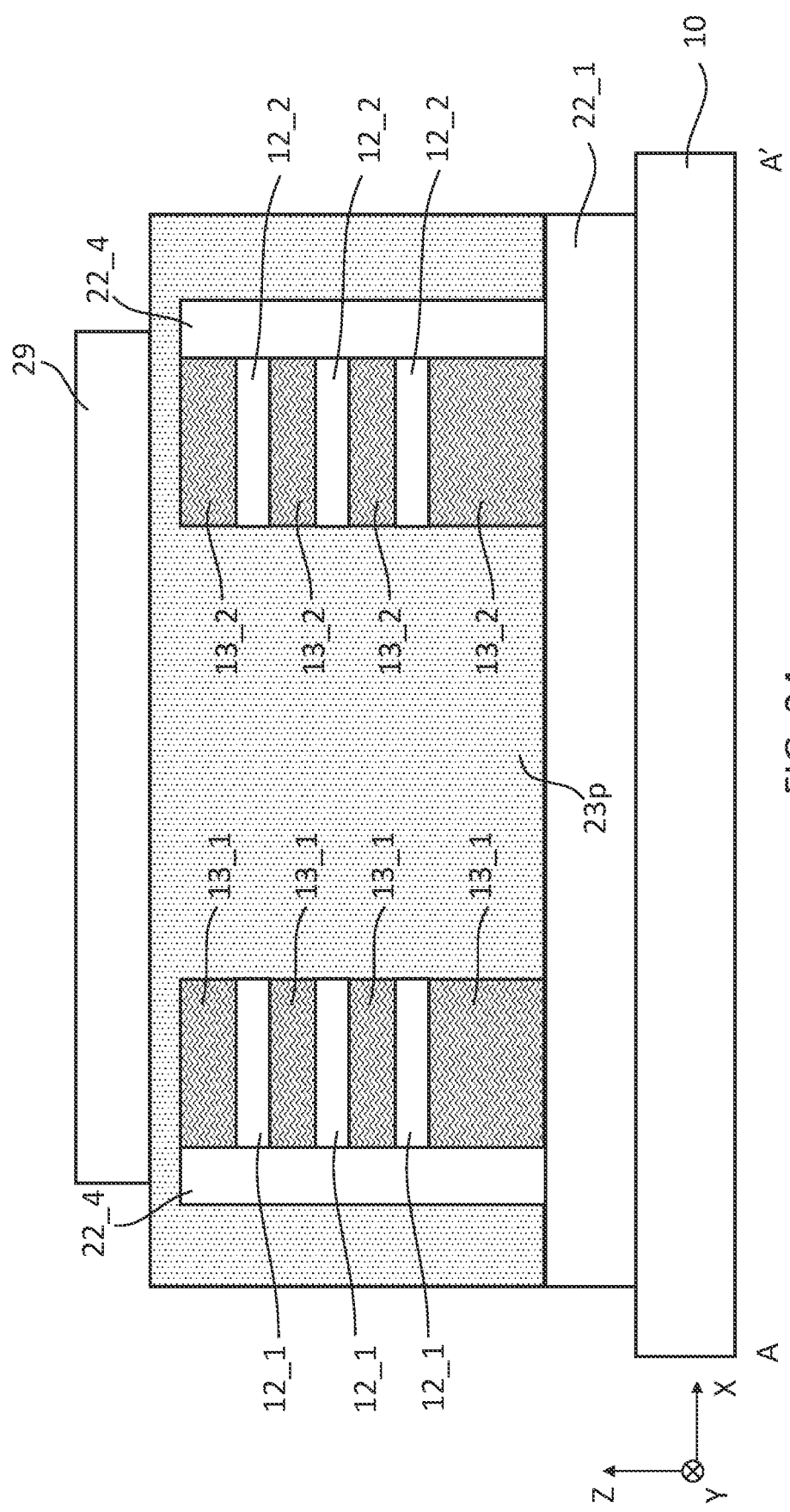

Referring to FIG. 24, the third portion 22_3 of the insulating layer 22 may be removed to expose the first channel layer 12_1, the first sacrificial layer 13_1, the second channel layer 12_2 and the second sacrificial layer 13_2 and then a preliminary gate sacrificial layer 23p may be formed on the first channel layer 12_1, the first sacrificial layer 13_1, the second channel layer 12_2 and the second sacrificial layer 13_2. Various processes (e.g., a dry etch process and/or a wet etch process) may be used to remove the third portion 22_3 of the insulating layer 22. A third mask layer 29 may be formed on the preliminary gate sacrificial layer 23p. The third mask layer 29 may be, for example, a photoresist layer.

Figure 25:
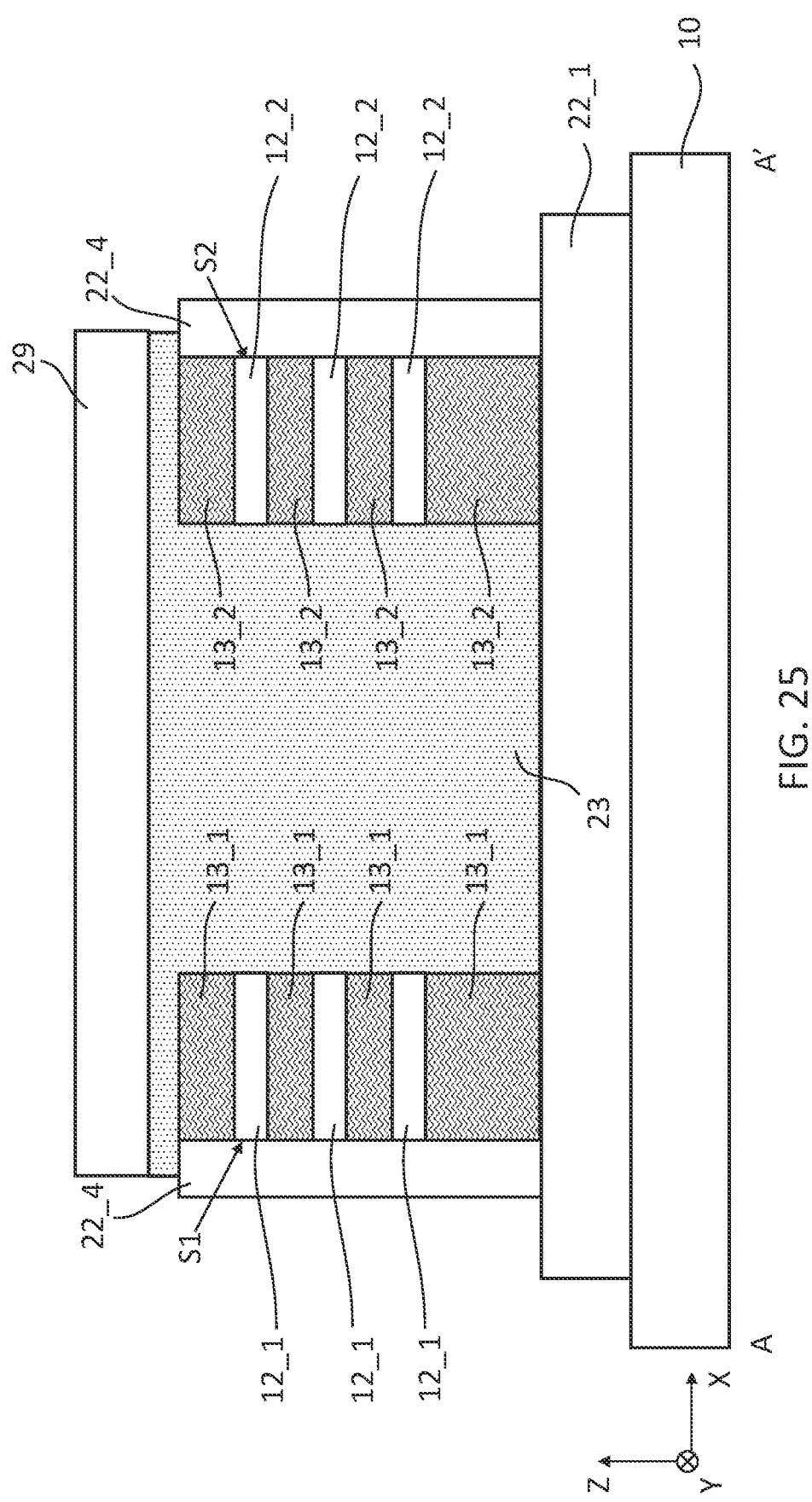

Referring to FIG. 25, portions of the preliminary gate sacrificial layer 23p may be removed using the third mask layer 29 as an etch mask using various processes (e.g., a dry etch process and/or a wet etch process) thereby forming a gate sacrificial layer 23 between the first channel layer 12_1 and the second channel layer 12_2. The fourth portions 22_4 of the insulating layer 22 may have an etch selectivity with respect to the preliminary gate sacrificial layer 23p and thus may not be removed while removing the portions of the preliminary gate sacrificial layer 23p. Accordingly, opposing side surfaces of the third mask layer 29 do not necessarily have to be aligned with the first surface S1 of the first channel layer 12_1 and the second surface S2 of the second channel layer 12_2. The fourth portions 22_4 of the insulating layer 22, therefore, may increase a lithography process margin while forming the third mask layer 29.

Figure 26:
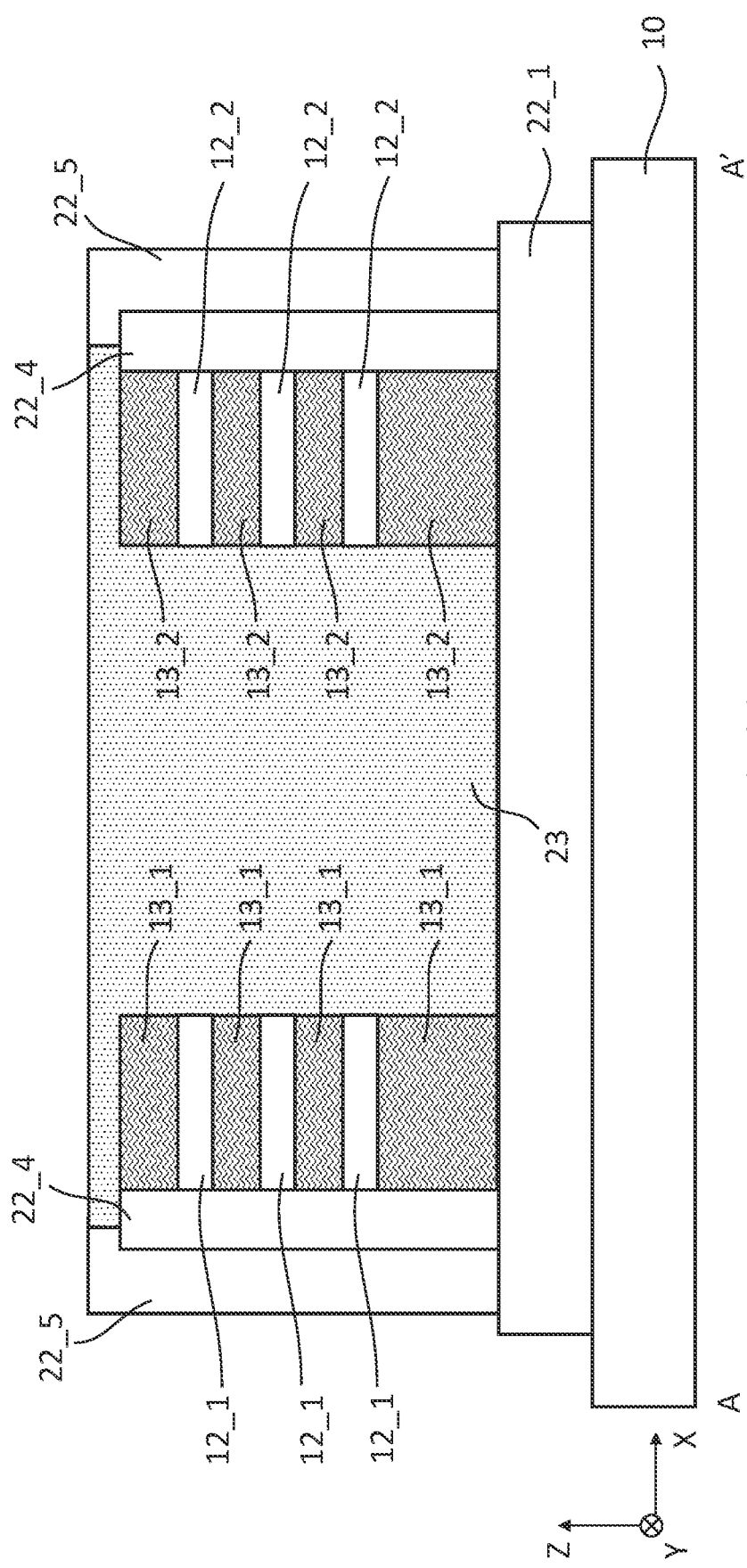
Figure 27:
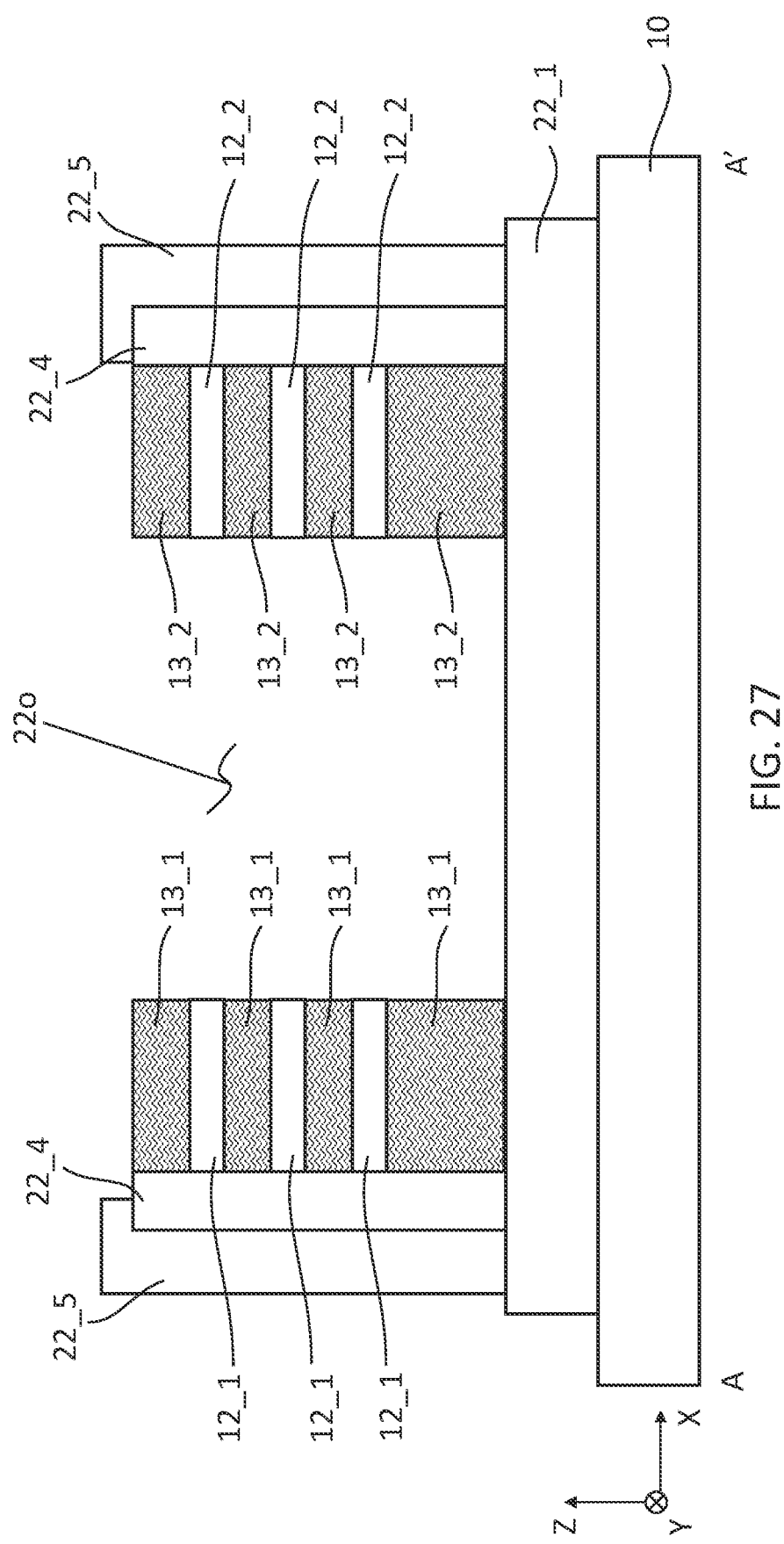

Referring to FIG. 26, the third mask layer 29 may be removed and a fifth portion 22_5 of the insulating layer 22 may be formed on the fourth portions 22_4 of the insulating layer 22. The fifth portion 22_5 of the insulating layer 22 may expose the gate sacrificial layer 23. In some embodiments, an upper surface of the fifth portion 22_5 of the insulating layer 22 may be coplanar with an upper surface of the gate sacrificial layer 23. Referring to FIG. 27, the gate sacrificial layer 23 may be removed thereby forming the opening 22o. The fifth portion 22_5 of the insulating layer 22 may include, for example, silicon oxide, silicon nitride, silicon oxynitride, silicon carbide and/or a low k material.

Figure 28:
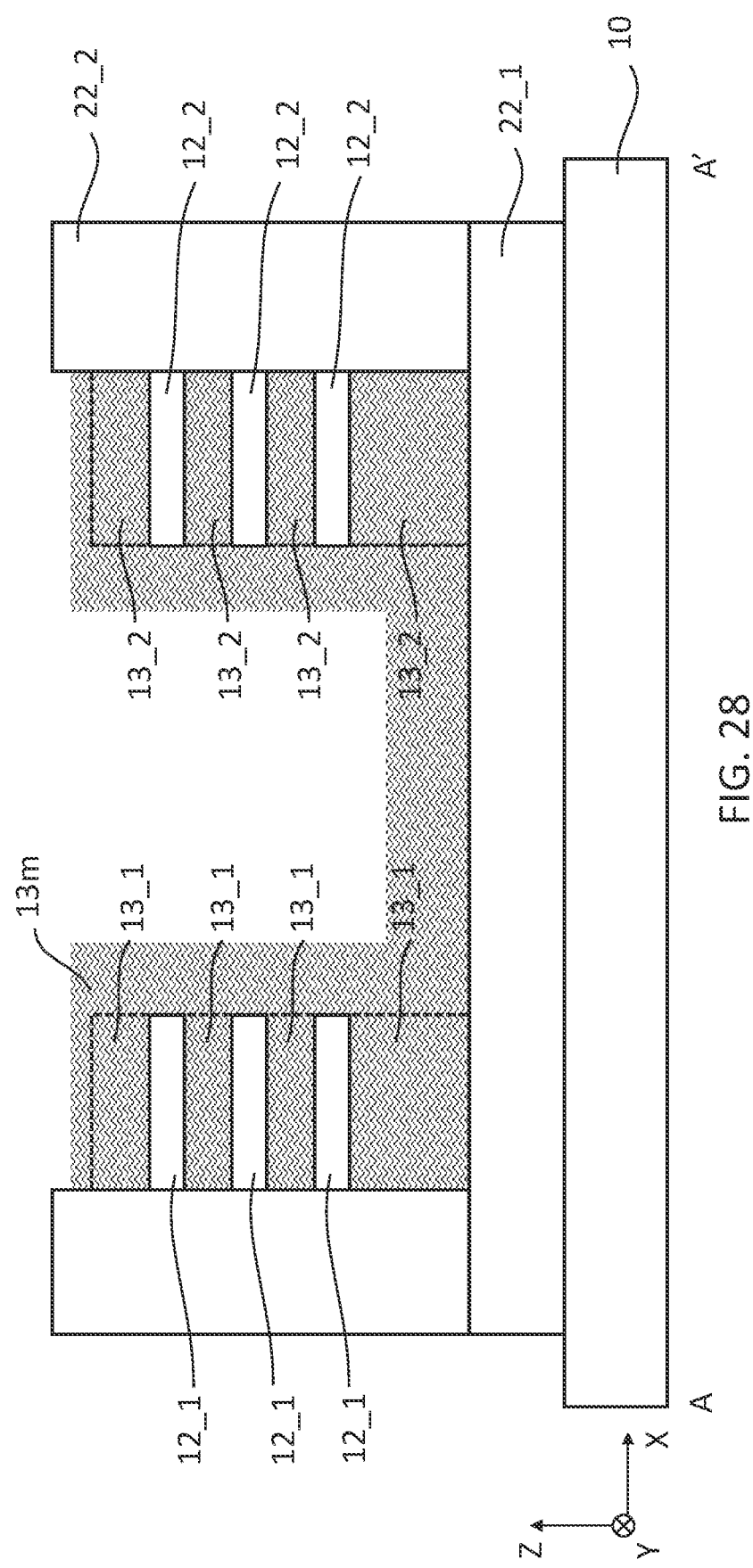
FIGS. 28 to 31 are cross-sectional views illustrating methods of forming a gate electrode according to some embodiments of the present invention.

FIGS. 28 to 31 are cross-sectional views illustrating methods of forming a gate electrode in an opening (Block 920 in FIG. 11). Referring to FIG. 28, the methods may include forming a merged sacrificial layer 13m on the structure illustrated in FIG. 18. The merged sacrificial layer 13m may contact the first channel layer 12_1, the first sacrificial layer 13_1, the second channel layer 12_2, and the second sacrificial layer 13_2. For example, the merged sacrificial layer 13m may be grown by an epitaxial growth process using the first sacrificial layer 13_1 and the second sacrificial layer 13_2 as a seed layer.

Figure 29:
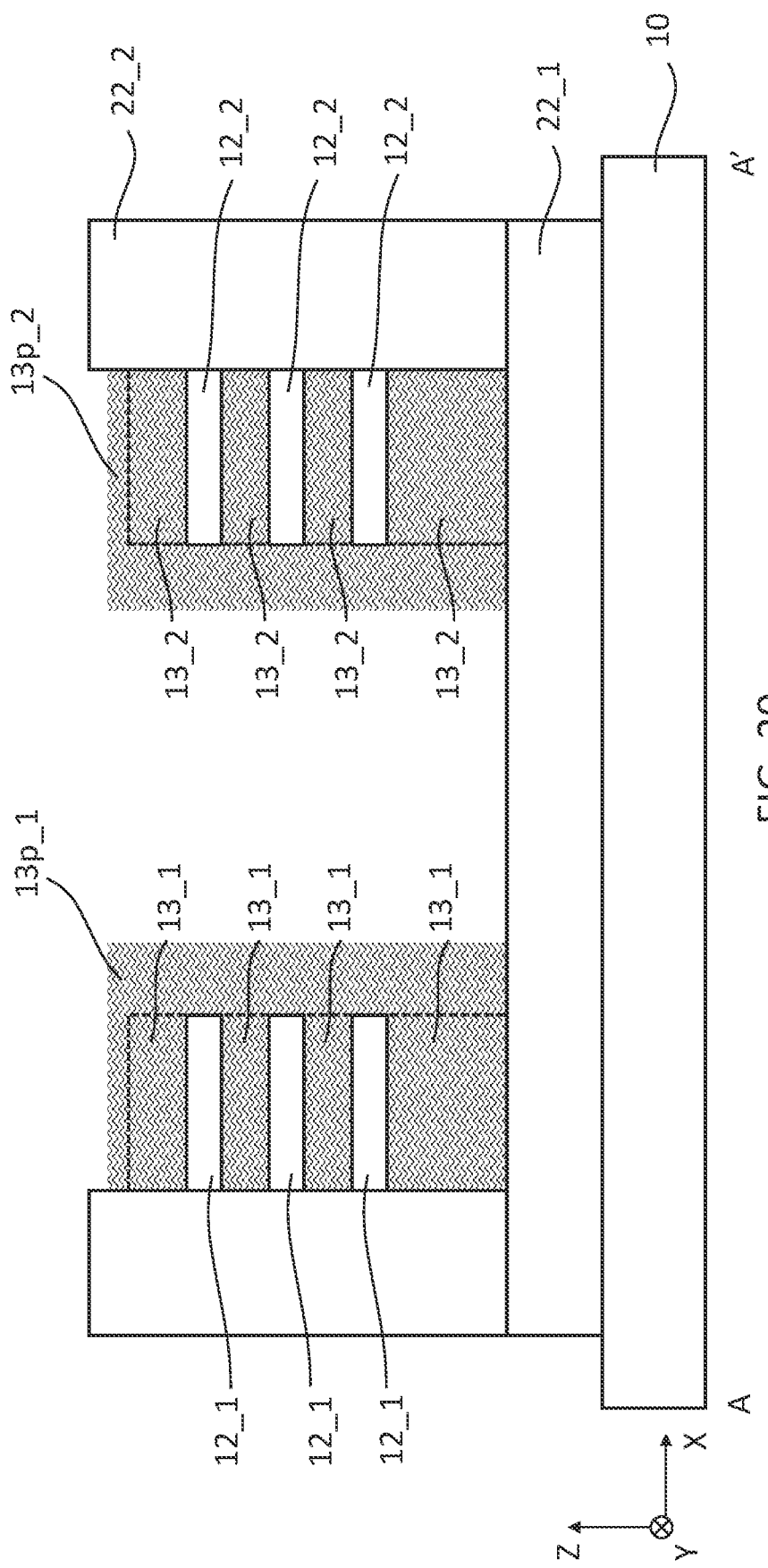

Referring to FIG. 29, a portion of the merged sacrificial layer 13m may be removed to expose a portion of the first portion 22_1 of the insulating layer 22 thereby forming first and second patterned sacrificial layers 13p_1 and 13p_2. The first and second patterned sacrificial layers 13p_1 and 13p_2 may be spaced apart from each other in the first direction.

Figure 30:
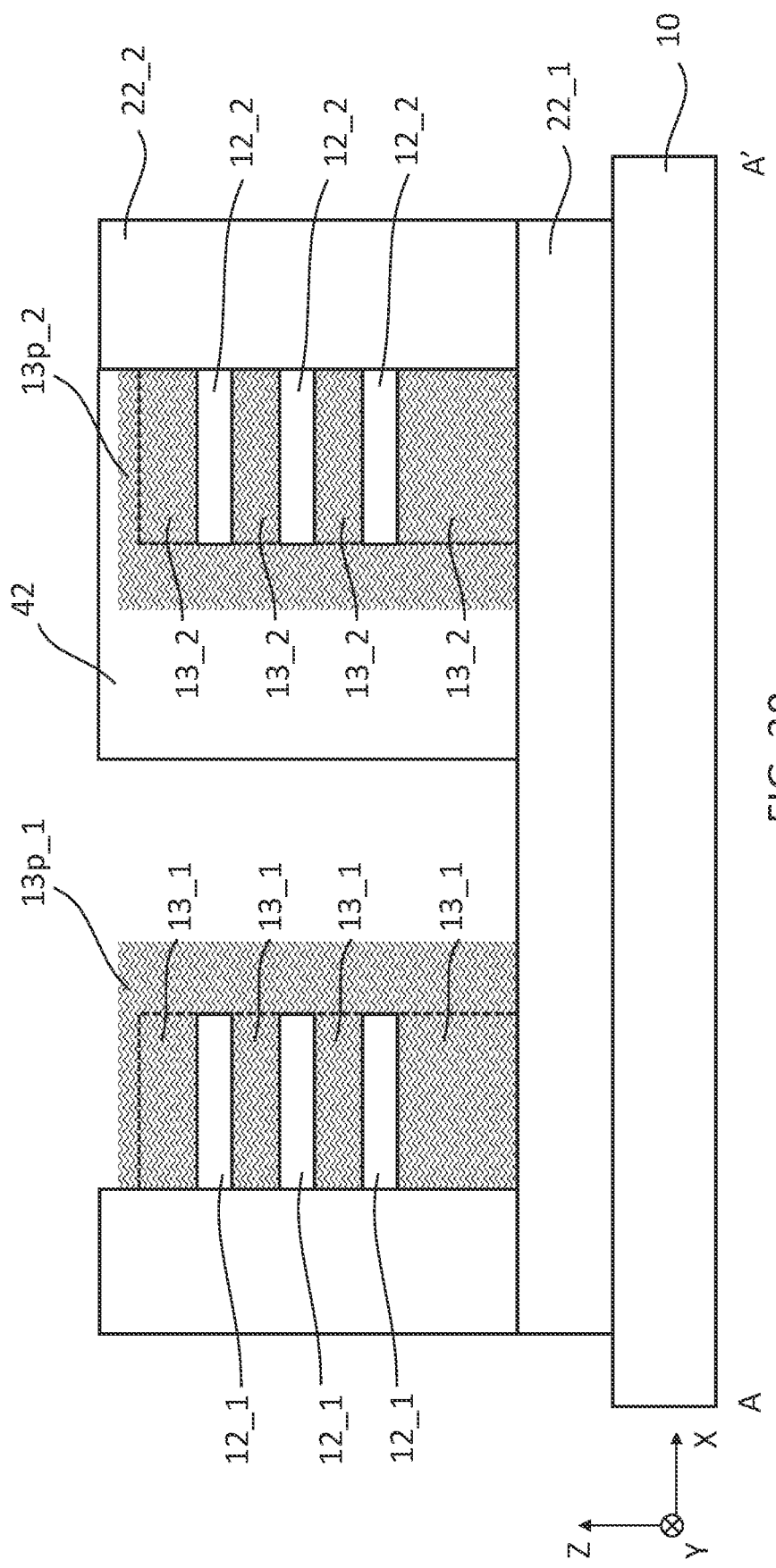
Figure 31:
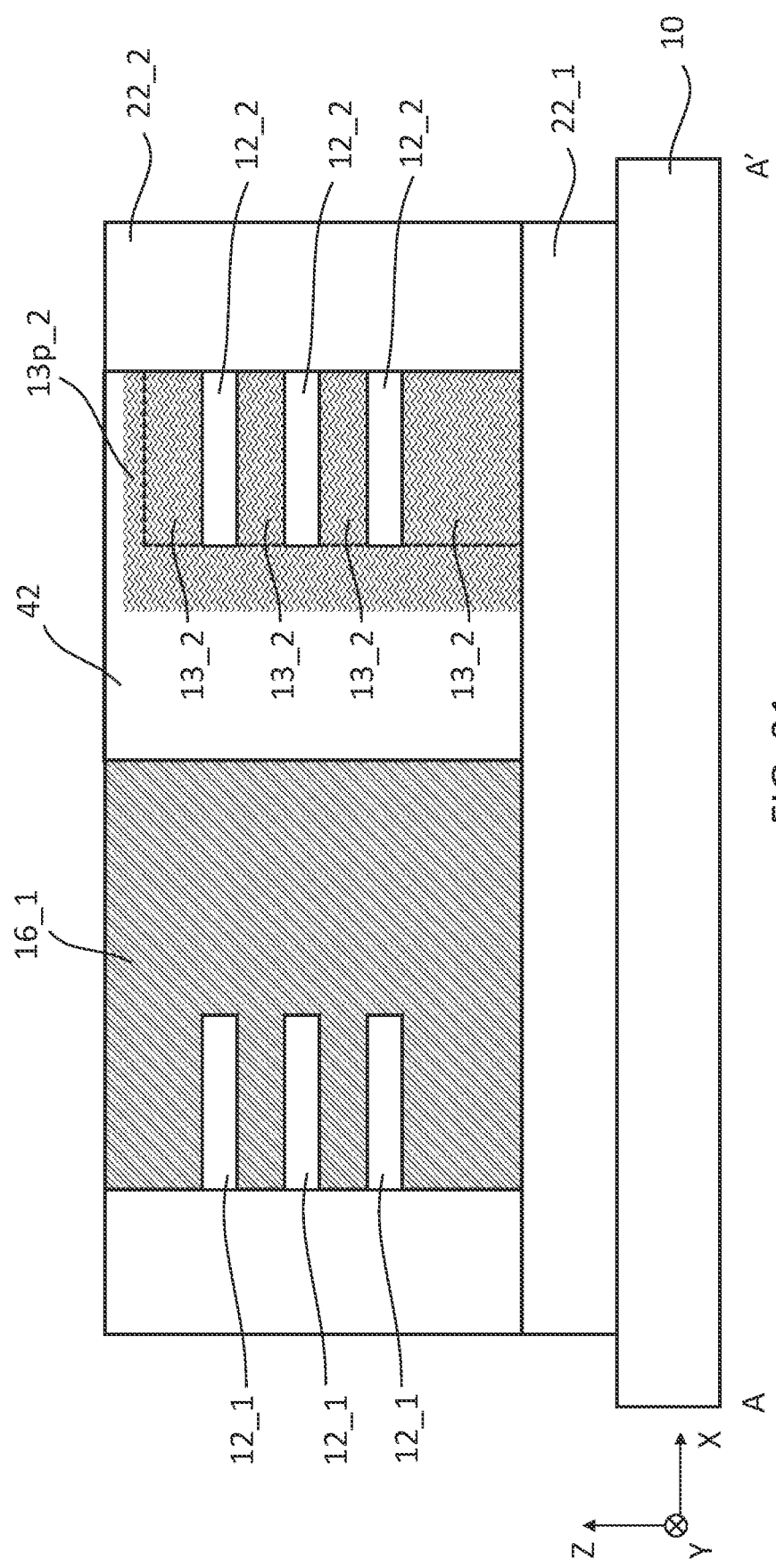

Referring to FIG. 30, a gate mask layer 42 may be formed on the second patterned sacrificial layer 13p_2. The gate mask layer 42 may be spaced apart from and may expose the first patterned sacrificial layer 13p_1. Referring to FIG. 31, the first sacrificial layer 13_1 and the first patterned sacrificial layer 13p_1 may be removed and then the first portion 16_1 of the gate electrode 16 may be formed on the first channel layer 12_1. The gate mask layer 42, the second patterned sacrificial layer 13p_2, and the second channel layer 13_2 may be removed after the first portion 16_1 of the gate electrode 16 is formed. Referring back to FIG. 21, the second portion 16_2 of the gate electrode 16 may be formed on the second channel layer 12_2 after the gate mask layer 42, the second patterned sacrificial layer 13p_2, and the second channel layer 13_2 are removed.

Example embodiments are described herein with reference to the accompanying drawings. Many different forms and embodiments are possible without deviating from the scope of the present invention. Accordingly, the present invention should not be construed as limited to the example embodiments set forth herein. Rather, these example embodiments are provided so that this disclosure will be thorough and complete and will convey the scope of the present invention to those skilled in the art. In the drawings, the sizes and relative sizes of layers and regions may be exaggerated for clarity. Like reference numbers refer to like elements throughout.

Example embodiments of the present invention are described herein with reference to cross-sectional views that are schematic illustrations of idealized embodiments and intermediate structures of example embodiments. As such, variations from the shapes of the illustrations as a result, for example, of manufacturing techniques and/or tolerances, are to be expected. Thus, example embodiments of the present invention should not be construed as limited to the particular shapes illustrated herein but include deviations in shapes that result, for example, from manufacturing, unless the context clearly indicates otherwise.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of the stated features, steps, operations, elements and/or components, but do not preclude the presence or addition of one or more other features, steps, operations, elements, components and/or groups thereof. As used herein the term "and/or" includes any and all combinations of one or more of the associated listed items.

It will be understood that although the terms first, second, etc. may be used herein to describe various elements, these elements should not be limited by these terms. These terms are only used to distinguish one element from another. Thus, a first element could be termed a second element without departing from the scope of the present invention.

It should also be noted that in some alternate implementations, the functions/acts noted in flowchart blocks herein may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Finally, other blocks may be added/inserted between the blocks that are illustrated, and/or blocks/operations may be omitted without departing from the scope of the present inventive concepts.

The above-disclosed subject matter is to be considered illustrative, and not restrictive, and the appended claims are intended to cover all such modifications, enhancements, and other embodiments, which fall within the scope of the invention. Thus, to the maximum extent allowed by law, the scope is to be determined by the broadest permissible interpretation of the following claims and their equivalents and shall not be restricted or limited by the foregoing detailed description.

What is claimed is:

1. An integrated circuit device comprising:
   a first channel layer comprising a first surface;
   a second channel layer that is spaced apart from the first channel layer in a first direction and comprises a second surface, wherein the first surface and the second surface are spaced apart from each other in the first direction and face opposite directions;
   a first gate electrode, wherein the first channel layer is in the first gate electrode, and the first gate electrode is absent from the first surface of the first channel layer; and
   a second gate electrode, wherein the second channel layer is in the second gate electrode, and the second gate electrode is absent from the second surface of the second channel layer.

2. The integrated circuit device of claim 1, wherein the first gate electrode comprises a third surface, and the second gate electrode comprises a fourth surface that is spaced apart from the third surface in the first direction, and
   the first surface of the first channel layer is coplanar with the third surface of the first gate electrode, and the second surface of the second channel layer is coplanar with the fourth surface of the second gate electrode.

3. The integrated circuit device of claim 1, wherein the first gate electrode comprises a third surface, and the second gate electrode comprises a fourth surface that is spaced apart from the third surface in the first direction, and
   wherein the integrated circuit device further comprises:
      a first source/drain region that is spaced apart from the first gate electrode in a second direction and contacts the first channel layer, wherein the second direction is different from the first direction, and the first source/drain region comprises a first portion that protrudes outward beyond the third surface of the first gate electrode and does not overlap the first gate electrode in the second direction; and
      a second source/drain region that is spaced apart from the second gate electrode in the second direction and contacts the second channel layer, wherein the second source/drain region comprises a second portion that protrudes outward beyond the fourth surface of the second gate electrode and does not overlap the second gate electrode in the second direction.

4. The integrated circuit device of claim 1, wherein the first gate electrode and the second gate electrode are spaced apart from each other in the first direction.

5. The integrated circuit device of claim 1, wherein the first gate electrode and the second gate electrode comprise different materials.

6. The integrated circuit device of claim 1, further comprising an insulating layer in which the first gate electrode and the second gate electrode are located,
   wherein the insulating layer contacts both the first surface of the first channel layer and the second surface of the second channel layer.

7. The integrated circuit device of claim 1, wherein the first gate electrode and the second gate electrode are portions of a common gate electrode, respectively, and the common gate electrode comprises a third surface and a fourth surface that is opposite the third surface and is spaced apart from the third surface in the first direction, and the common gate electrode continuously extends from the third surface to the fourth surface.

8. The integrated circuit device of claim 1, wherein the first gate electrode comprises a third surface, and the second gate electrode comprises a fourth surface that is spaced apart from the third surface of the first gate electrode in the first direction,
  the first channel layer comprises a first protruding portion that comprises the first surface of the first channel layer and protrudes outward beyond the third surface of the first gate electrode, and
  the second channel layer comprises a second protruding portion that comprises the second surface of the second channel layer and protrudes outward beyond the fourth surface of the second gate electrode.

9. An integrated circuit device comprising:
  a first transistor comprising a first channel layer and a first gate electrode; and
  a second transistor comprising a second channel layer and a second gate electrode,
  wherein the first channel layer comprises a first surface,
  wherein the second channel layer is spaced apart from the first channel layer in a first direction and comprises a second surface,
  wherein the first surface and the second surface are spaced apart from each other in the first direction and face opposite directions,
  wherein the first channel layer is in the first gate electrode, and the first gate electrode comprises a third surface,
  wherein the second channel layer is in the second gate electrode, and the second gate electrode comprises a fourth surface,
  wherein the third surface and the fourth surface are spaced apart from each other in the first direction and face opposite directions,
  wherein a first center of the first channel layer in the first direction is closer to the third surface of the first gate electrode than a center of the third surface and the fourth surface in the first direction,
  wherein a second center of the second channel layer in the first direction is closer to the fourth surface of the second gate electrode than the center of the third surface and the fourth surface in the first direction,
  wherein the first transistor has an asymmetric structure with respect to a central portion of the first transistor in the first direction, and
  wherein the second transistor has an asymmetric structure with respect to a central portion of the second transistor in the first direction.

10. The integrated circuit device of claim 9, further comprising:
  a first source/drain region that is spaced apart from the first gate electrode in a second direction and contacts the first channel layer, wherein the second direction is different from the first direction; and
  a second source/drain region that is spaced apart from the second gate electrode in the second direction, is spaced apart from the first source/drain region in the first direction, and contacts the second channel layer,
  wherein the first source/drain region comprises a first outer surface, the second source/drain region comprises a second outer surface, and the first outer surface and the second outer surface are spaced apart from each other and face opposite directions, and
  the third surface of the first gate electrode is between the first outer surface of the first source/drain region and the fourth surface of the second gate electrode in the first direction, and the fourth surface of the second gate electrode is between the second outer surface of the second source/drain region and the third surface of the first gate electrode in the first direction.

11. The integrated circuit device of claim 9, further comprising an insulating layer in which the first gate electrode and the second gate electrode are located, and
  wherein the insulating layer contacts both the first surface of the first channel layer and the second surface of the second channel layer.

12. The integrated circuit device of claim 9, wherein the third surface of the first gate electrode is coplanar with the first surface of the first channel layer, and the fourth surface of the second gate electrode is coplanar with the second surface of the second channel layer.

13. The integrated circuit device of claim 9, wherein the first gate electrode and the second gate electrode are portions of a common gate electrode, respectively, and the common gate electrode continuously extends from the third surface to the fourth surface.

14. The integrated circuit device of claim 9, wherein the first gate electrode and the second gate electrode are spaced apart from each other in the first direction.

15. The integrated circuit device of claim 9, wherein the first gate electrode covers the first surface of the first channel layer, and the second gate electrode covers the second surface of the second channel layer.

16. An integrated circuit device comprising:
  a first channel layer that extends in length in a first direction comprising a first surface;
  a second channel layer that extends in length in the first direction and is spaced apart from the first channel layer in a second direction, the second channel layer comprising a second surface, wherein the first surface and the second surface are spaced apart from each other in the second direction and face opposite directions;
  a first gate electrode that extends in the second direction and comprises a third surface, wherein the first channel layer is in the first gate electrode and the third surface of the first gate electrode is coplanar with the first surface of the first channel layer; and
  a second gate electrode that extends in the second direction and comprises a fourth surface, wherein the second channel layer is in the second gate electrode and the fourth surface of the second gate electrode is coplanar with the second surface of the second channel layer.

17. The integrated circuit device of claim 16, wherein the first gate electrode and the second gate electrode are portions of a common gate electrode, respectively, and the common gate electrode continuously extends from the third surface to the fourth surface.

18. The integrated circuit device of claim 16, wherein the first gate electrode and the second gate electrode comprise different materials.

19. The integrated circuit device of claim 16, wherein the first gate electrode and the second gate electrode each comprise a respective main gate layer and a respective work function layer.

20. The integrated circuit device of claim 19, wherein the main gate layer of the first gate electrode and the main gate layer of the second gate electrode include a same material.

* * * * *